US012710463B2

(12) United States Patent
Gohel et al.

(10) Patent No.: US 12,710,463 B2
(45) Date of Patent: Aug. 18, 2026

(54) ANALYZING BUNDLES OF WIRES

(71) Applicant: Teradyne, Inc., North Reading, MA (US)

(72) Inventors: Tushar Gohel, Winchester, MA (US); Zachary Farrer, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 93 days.

(21) Appl. No.: 18/657,422

(22) Filed: May 7, 2024

(65) Prior Publication Data

US 2025/0347729 A1 Nov. 13, 2025

(51) Int. Cl.
*G01R 31/11* (2006.01)

(52) U.S. Cl.
CPC .................................... *G01R 31/11* (2013.01)

(58) Field of Classification Search
CPC ..................................................... G01R 31/11
See application file for complete search history.

(56) References Cited

U.S. PATENT DOCUMENTS 3,912,877 A * 10/1975 Braun .................... H04Q 3/521 340/2.21
4,734,637 A 3/1988 Chen et al.
5,570,029 A * 10/1996 Bottman .................. H04B 3/46 324/628
6,563,352 B1 5/2003 Gohel et al.
6,868,357 B2 3/2005 Furse
6,885,954 B2 4/2005 Jones et al.
6,894,505 B2 5/2005 Gohel
6,937,944 B2 8/2005 Furse et al.
6,999,504 B1 * 2/2006 Amrany .................... H04L 5/20 375/222
7,069,163 B2 6/2006 Gunther et al.
7,075,309 B2 7/2006 Smith
7,165,200 B2 1/2007 Jani et al.
7,215,126 B2 5/2007 Furse et al.
7,250,772 B2 7/2007 Furse et al.
7,271,596 B2 9/2007 Furse et al.
7,282,922 B2 10/2007 Lo et al.

(Continued)

OTHER PUBLICATIONS

Furse et al., "A critical comparison of reflectometry methods for location of wiring faults," Smart Structures and Systems, vol. 2, No. 1, pp. 25-46 (2006), 22 pages.

(Continued)

*Primary Examiner* — Paresh Patel
(74) *Attorney, Agent, or Firm* — ARENTFOX SCHIFF LLP

(57) ABSTRACT

An example system is configured to detect a fault in a bundle of wires. The bundle of wires include a first wire and a second wire. The system includes a first driver that is electrically connectable to, and electrically disconnectable from, the first wire; a second driver that is electrically connectable to, and electrically disconnectable from, the second wire; and a control system to control the first driver to electrically connect to the first wire and to output a signal to the first wire, to control the second driver to electrically connect to the second wire and to drive a static voltage to the second wire to enable the second wire to act as a signal return for the first wire, and to detect a fault in the first wire based on a reflection of the signal on the first wire.

27 Claims, 18 Drawing Sheets

(56) References Cited

U.S. PATENT DOCUMENTS

| | | | | |
|---|---|---|---|---|
| 7,495,450 | B2 | 2/2009 | Furse et al. | |
| 7,548,071 | B2 | 6/2009 | Harrison et al. | |
| 7,622,931 | B2 | 11/2009 | Wu et al. | |
| 7,634,012 | B2 | 12/2009 | Farhang-Boroujeny et al. | |
| 8,310,270 | B2 | 11/2012 | Gohel et al. | |
| 8,914,566 | B2 | 12/2014 | Vandervalk et al. | |
| 9,244,117 | B2 | 1/2016 | Furse et al. | |
| 10,250,957 | B2 | 4/2019 | Gohel et al. | |
| 10,404,363 | B2 | 9/2019 | Gohel et al. | |
| 10,404,364 | B2 | 9/2019 | Gohel et al. | |
| 10,504,307 | B2 | 12/2019 | Courter et al. | |
| 10,523,316 | B2 | 12/2019 | Gohel et al. | |
| 10,564,219 | B2 | 2/2020 | Gohel et al. | |
| 10,715,250 | B2 | 7/2020 | Gohel et al. | |
| 2003/0061701 | A1* | 4/2003 | Osaka | G01R 31/11 361/783 |
| 2003/0200407 | A1* | 10/2003 | Osaka | G06F 13/4086 711/167 |
| 2004/0056666 | A1 | 3/2004 | Gohel | |
| 2005/0146320 | A1 | 7/2005 | Gohel | |
| 2006/0161827 | A1* | 7/2006 | Gohel | G01R 31/31924 714/736 |
| 2009/0091347 | A1 | 4/2009 | Gohel et al. | |
| 2012/0106351 | A1 | 5/2012 | Gohel et al. | |
| 2013/0106399 | A1 | 5/2013 | Gohel et al. | |
| 2013/0110445 | A1 | 5/2013 | Kaushansky et al. | |
| 2013/0110446 | A1 | 5/2013 | Bourassa et al. | |
| 2013/0124134 | A1 | 5/2013 | Gohel | |
| 2018/0316420 | A1 | 11/2018 | Gohel et al. | |
| 2018/0316421 | A1 | 11/2018 | Gohel et al. | |
| 2018/0316423 | A1 | 11/2018 | Gohel et al. | |
| 2018/0316424 | A1 | 11/2018 | Gohel et al. | |
| 2018/0316990 | A1 | 11/2018 | Gohel et al. | |
| 2019/0033372 | A1 | 1/2019 | Gohel et al. | |
| 2021/0194595 | A1 | 6/2021 | Gohel et al. | |
| 2022/0329284 | A1* | 10/2022 | Chechik | H04R 1/1091 |
| 2023/0280393 | A1 | 9/2023 | Gohel et al. | |

OTHER PUBLICATIONS

Furse et al., "Feasibility of Spread Spectrum Sensors for Location of Arcs on Live Wires," IEEE Sensors Journal, vol. 5, No. 6, pp. 1445-1450 (2005), 6 pages.

Furse et al., "Spread spectrum sensors for critical fault location on live wire networks," Structural Control and Health Monitoring 12:257-267 (2005), 11 pages.

LiveWire company overview, "Patented technology for monitoring, detecting and locating electrical faults in live systems," LiveWire Innovation, Inc. (Mar. 23, 2016), 1 page.

LiveWire Innovation, "Sentinel 100 SSTDR Engine LW-S100: Live Monitoring of Electrical Systems for the Detection and Location of Faults," [online] Retrieved from the Internet <URL: https://www.livewireinnovation.com/sstdr/> (2018), 7 pages.

LiveWire Innovation, "Sentinel 100 SSTDR Engine: Live Monitoring for the Detection and Location of Faults in Cables and Wires," LiveWire Innovation, Inc. (2017), 2 pages.

Reis et al., "Sequence and Spread Spectrum Time Domain Reflectometry for Transmission Line Analysis," Conference Proceedings of SPIE (Sep. 2007), 11 pages.

Sharma et al., "Low-Power STDR CMOS Sensor for Locating Faults in Aging Aircraft Wiring," IEEE Sensors Journal, vol. 7, No. 1, pp. 43-50 (2007), 8 pages.

Smith et al., "Analysis of Spread Spectrum Time Domain Reflectometry for Wire Fault Location," IEEE Sensors Journal, vol. 5, No. 6, pp. 1469-1478 (2005), 10 pages.

Stephenson, J., "Eliminating False Positives in the Detection and Location of sub 3ms Faults on AC/DC Lines," LiveWire Test Labs, Inc. (Apr. 11, 2011), 8 pages.

"Understanding switched-mode power supplies (SMPS)", The Design Engineers' Guide, Avnet Abacus, 5 pages.

* cited by examiner

ANALYZING BUNDLES OF WIRES

TECHNICAL FIELD

This specification describes example implementations of techniques for analyzing bundles of wires.

BACKGROUND

Example time domain reflectometry (TDR) testing includes outputting an electrical signal containing an incident edge onto a wire, measuring the incident edge and a reflection of the incident edge on the wire, and determining a signal path length based on a difference between the two measurements. U.S. Pat. No. 4,734,637, titled "Apparatus For Measuring The Length Of An Electrical Line", describes an example TDR implementation.

SUMMARY

An example system is configured to detect a fault in a bundle of wires. The bundle of wires include a first wire and a second wire. The system includes a first driver that is electrically connectable to, and electrically disconnectable from, the first wire; a second driver that is electrically connectable to, and electrically disconnectable from, the second wire; and a control system to control the first driver to electrically connect to the first wire and to output a signal to the first wire, to control the second driver to electrically connect to the second wire and to drive a static voltage to the second wire to enable the second wire to act as a signal return for the first wire, and to detect a fault in the first wire based on a reflection of the signal on the first wire. The system may include one or more of the following features, either alone or in combination.

The bundle of wires may include a third wire and a fourth wire. The system may include a third driver that is electrically connectable to, and electrically disconnectable from, the third wire; and a fourth driver that is electrically connectable, and electrically disconnectable from, the fourth wire. The control system may be configured to control the third driver to electrically connect to the third wire and to output a signal to the third wire, to control the fourth driver to electrically connect to the fourth wire and to drive a static voltage to the fourth wire to enable the fourth wire to act as a signal return for the third wire, and to detect a fault in the third wire based on a reflection of the signal on the third wire. The static voltage may be ground voltage or a direct current (DC) voltage.

The control system may be configured to identify the second wire based on an amount of crosstalk between the first wire and the second wire. Identifying the second wire based on the amount of crosstalk may include determining that the amount of crosstalk from the first wire on the second wire is greater than amounts of crosstalk on the second wire from one or more other wires. Identifying the second wire based on the amount of crosstalk may include comparing the amount of crosstalk from the first wire on the second wire to a predefined threshold; and identifying the second wire when the amount of crosstalk is greater than the predefined threshold. The predefined threshold may be based on an attribute of the signal on the first wire. The predefined threshold may be 5% or more of the attribute of the signal on the first wire or 3% or more of the attribute of the signal on the first wire.

The first wire and the second wire may be in physical proximity to each other such that a characteristic impedance of the first wire relative to the second wire is 150Ω or less. The first wire and the second wire may be in physical proximity to each other such that a characteristic impedance of the first wire relative to the second wire is 100Ω or less. The first wire and the second wire may be in physical proximity to each other such that a characteristic impedance of the first wire relative to the second wire is between 40Ω and 150Ω inclusive.

The bundle of wires may include multiple wires including the second wire. The system may include multiple drivers that are electrically connectable to, and electrically disconnectable from, respective ones of the multiple wires. The control system may be configured to control the multiple drivers to electrically connect to respective one of the multiple wires to each drive a static voltage to a respective one of multiple wires to enable each of the multiple wires to act as a signal return for the first wire. The first wire may be bordered, at least in part, by two or more of the multiple wires. The first wire may be surrounded by three or more of the multiple wires.

The system may include circuitry to detect the data following output of the signal to the first wire. The data may be based on a reflection of the signal on the first wire. The control system may be configured to detect a fault, a short circuit, or an open circuit on the first wire based on the data. The control system may be configured to use at least one of time domain reflectometry (TDR) testing, spread spectrum TDR (SSTDR) testing, or sequence TDR (STDR) testing to detect the fault, the short circuit, or the open circuit.

An example method is for testing a first wire. The method includes controlling a first driver to output a signal on the first wire; controlling a second driver to drive a static voltage to the second wire to cause the second wire to act as a signal return for the first wire; obtaining data based on a reflection of the signal on the first wire; and testing the first wire based on the data. The method may include one or more of the following features, either alone or in combination.

The method may include identifying the second wire based on an amount of crosstalk between the first wire and the second wire. Identifying the second wire based on the amount of crosstalk may include determining that the amount of crosstalk from the first wire on the second wire is greater than amounts of crosstalk on the second wire from one or more other wires. Identifying the second wire may include comparing the amount of crosstalk from the first wire on the second wire to a predefined threshold, and identifying the second wire if the amount of crosstalk is greater than the predefined threshold. The predefined threshold may be based on an attribute of a signal on the first wire. The predefined threshold may be 5% or more of the attribute of the signal on the first wire or 3% or more of the attribute of the signal on the first wire.

The method may include controlling multiple drivers to each drive a static voltage to a respective one of multiple wires to cause one or more of the multiple wires to act as a signal return for the first wire. The multiple drivers may include the second driver and the multiple wires may include the second wire.

Any two or more of the features described in this specification, including in this summary section, may be combined to form implementations not specifically described in this specification.

At least part of the devices, systems, circuitry, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, circuitry, and processes described in this specification may be configured or controlled using a computing system comprised of one or more processing devices and memory storing instructions that are executable by the one or more processing devices to perform various control operations. The devices, systems, circuitry, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example techniques for analyzing bundles of wires which include injecting a signal into a target wire in the bundle and detecting at least a predetermined amount of crosstalk in one or more other wires in the bundle. Those one or more other wires are identified as electrical return(s) for the target wire and may be designated as such. An example electrical return (or simply "return" or "return path") includes wiring that completes a circuit and carries current back to a power source or a voltage reference such as electrical ground (or simply "ground"). The techniques may be used to identify a return for each wire in the bundle. For example, a signal may be injected, in turn, into each wire in the bundle and return(s) may be identified for each wire in the bundle. The identities of wires and their respective returns may be stored in computer memory and used during subsequent testing of the wires. Examples of such testing include, but are not limited to, time domain reflectometry (TDR) testing including, but not limited to, the techniques described herein.

An example wire or bundle of wires may include includes any type of cables, transmission lines, printed circuit board (PCB) microstrips or striplines, or other type of electrically-conductive medium capable of transmitting electrical signals. An electrical signal can include, but is not limited to, current, voltage, and electromagnetic waves. A wire may include an assembly comprised of two or more such cables, transmission lines, PCB microstrips or striplines, or other type of electrically conductive media connected using one or more electrical connectors. A wire may include different types of cable(s), transmission line(s), PCB striplines and microstrips and/or electrically-conductive media connected by connectors, relays, or other devices.

Figure 1:
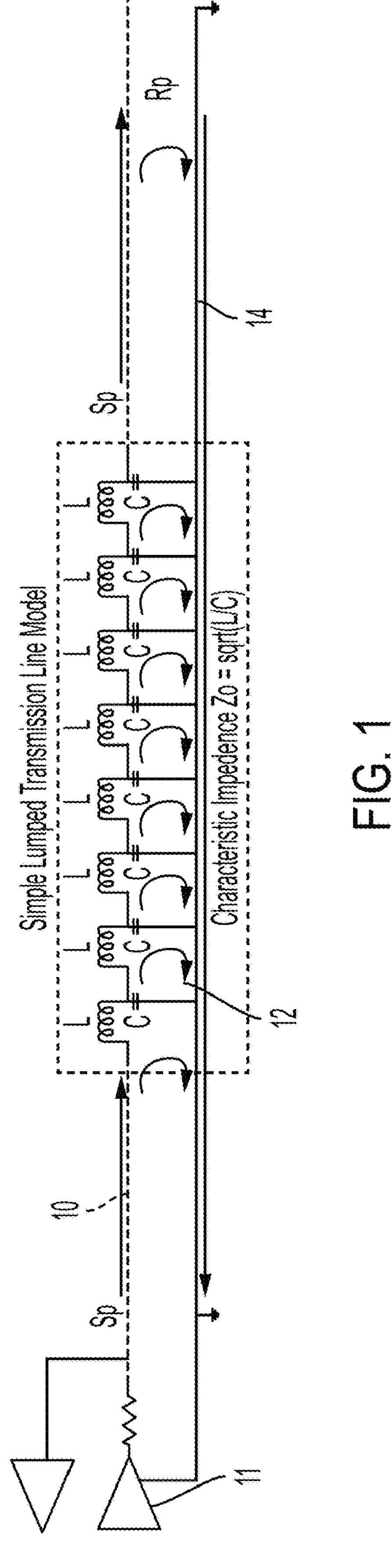
FIG. 1 is a block diagram of an example transmission line showing example loop currents to ground.

FIG. 1 shows an example of a wire 10. In particular, FIG. 1 shows a simple lumped model of a transmission line. Kirchhoff's Current Law (KCL) states that the sum of currents flowing into a node is equal to the sum of the currents out of the node. As shown in FIG. 1, a driver 11 drives a current signal onto wire 10. Driving herein includes, but is not limited to, to sending, outputting, forcing, applying, or the like a signal to an electrical conductor (or simply, "conductor"). As the current signal propagates through wire 10, small inductive-capacitive (LC) current loops are produced, an example of which is LC current loop 12. These current loops allow the current signal to return to electrical ground. In this example, Sp denotes the signal path, which is the wire in which the current signal is injected, and Rp denotes the return path 14 for the current signal, which is a path to electrical ground in this example.

Figure 2:
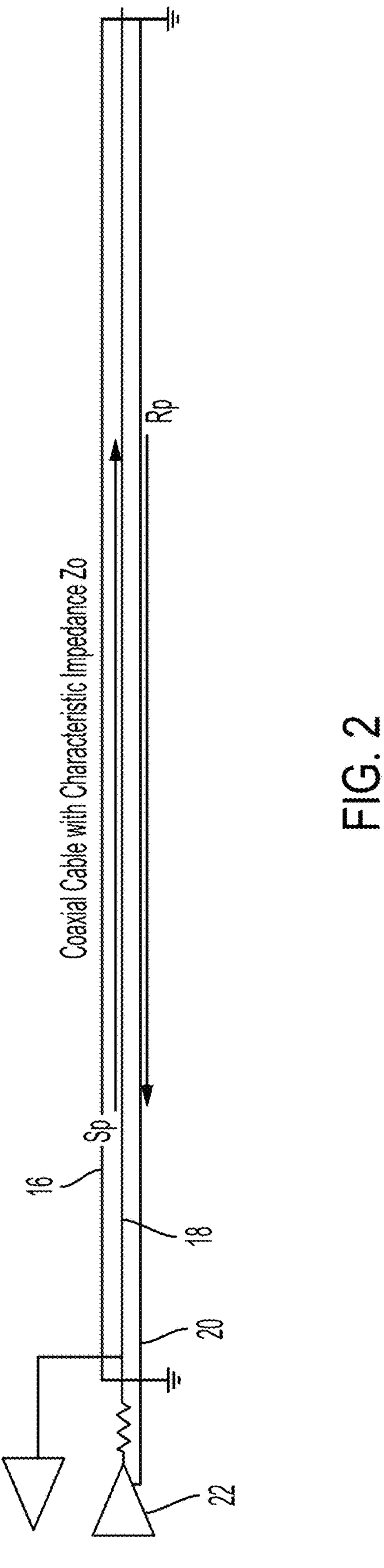
FIG. 2 is a block diagram of an example coaxial cable.

FIG. 2 is a diagram of an example wire—in this example, coaxial cable 16—containing a conductor 18 that defines a signal path Sp and a ground shield 20 that defines return path, Rp. A driver 22 drives conductor 18 and the return path is through ground shield 20. Relating this to FIG. 1, the LC current loops, which are illustrated in FIG. 1, occur here between the signal path of the coaxial cable and the ground shield of the coaxial cable, where the inductance is primarily determined by the geometries of the conductor 18 and the capacitance is determined by dielectric material between the conductor and the shield and a distance between the conductor and the shield.

Figure 3:
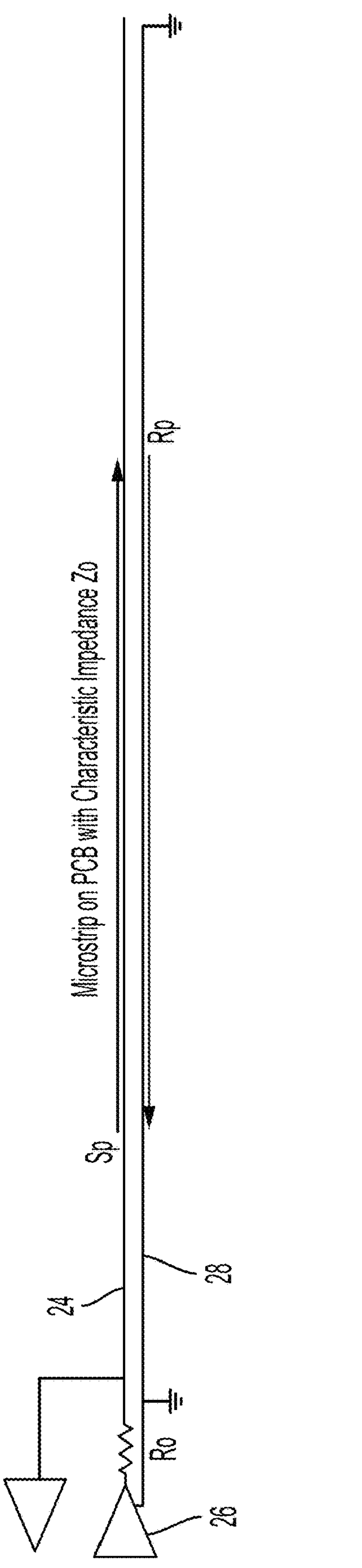
FIG. 3 is a block diagram of an example microstrip on a circuit board.

FIG. 3 is a diagram of an example wire—in this example, a conductive trace 24 on a microstrip printed circuit board (PCB). As shown in FIG. 3 a driver 26 drives the conductive trace 24 on the PCB and the return path is through the ground plane 28 that is under the conductive trace. Relating this to FIG. 1, the LC current loops here occur between the signal path of the conductive trace 24 and the ground plane 28 where the inductance is primarily determined by the geometries of the signal trace and the capacitance is determined by the geometries of the signal trace, a dielectric material of the PCB, and a distance between the conductive trace and ground plane.

The wires shown in FIGS. 2 and 3 are examples of uniform transmission lines. Uniform transmission lines include lossy transmission lines. TDR measurements of uniform transmission lines can be very consistent. In some implementations, TDR measurements can be used to determine the impedance of a point along a transmission line, by sending a waveform along the transmission line and processing data based on a signal which is a reflected version of the waveform that is reflected back along the transmission line. In some examples, if the transmission line is uniform and consistent, the same waveform will be reflected back along the transmission line every time or almost every time. If there are changes in impedance on the transmission line from test to test, the reflected waveform will also vary from test to test. A test includes sending a signal on a wire and detecting data from that signal's reflection on the same wire.

An issue to be addressed is determining intermittent faults on a wire where the return path is not known. Examples of faults include, but are not limited to, open circuits, short circuits, and unexpected impedances on the wire. In some cases, a fault on a wire is intermittent if the fault changes from test to test. For example, a fault on a wire may be considered intermittent if the same signal is sent on that wire multiple times and tests performed on different reflections of that same signal indicate a fault in some cases and no fault in other cases. Intermittent faults may be difficult to detect. That is, because they occur only some of the time, they may not always be detected. One way to check for intermittent faults is to test a wire over time using the same signals.

When the return path of a wire is unknown, the impedance of that wire varies as the distance changes between the wire and other wires that have a relatively low impedance to ground. Referring to FIG. 1, wire 10 appears inductive. If this wire is moved, shaken, or folded, the impedance of wire 10 is likely to vary due to distance changes to the return path, which may indicate a fault when, in fact, there is no fault in the wire.

Wire assemblies may include individual unshielded wires bundled together over long runs, such as 15 meters (m) or more. There may be a hard fault or intermittent fault in one or more of the wires due to damage, poor assembly, or interconnects. Since the wires are bundled and the signals are unshielded, there may be no clear return path for a signal during TDR testing. The techniques described herein address this issue by identifying, in a bundle of wires, one or more wires that can function as a return for a target wire. In the context of a test system such as automatic test equipment (ATE), each wire may be connected to, or part of, a test channel of the ATE.

Figure 4:
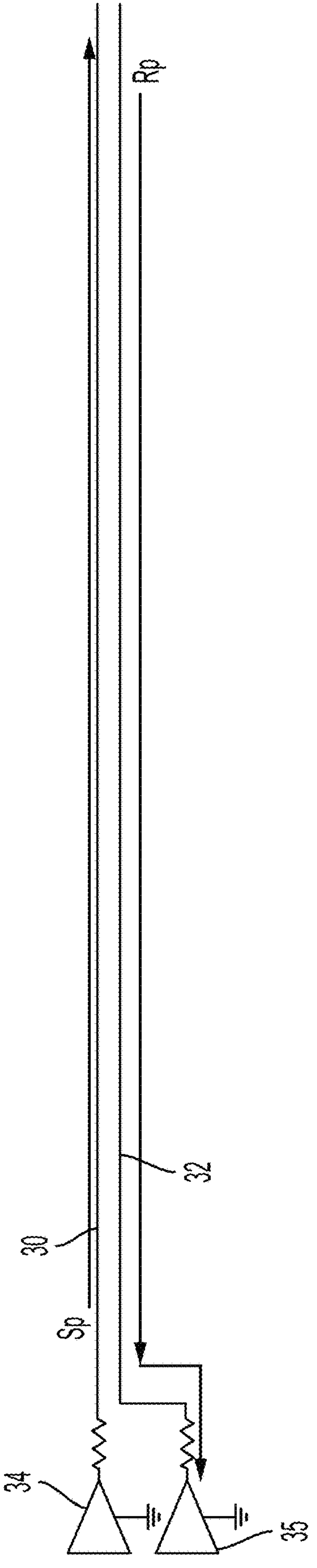
FIG. 4 is a block diagram of example transmission lines, with one transmission line functioning as a return path for the other transmission line.

In the example of FIG. 4, there is a relatively low impedance between each wire 30, 32 and ground. Driver 34 may be used to generate a TDR signal that is applied to wire 30. Wire 32 is held to a static voltage, such as a direct current (DC) voltage by driver 35. As a result, wire 32 can operate as the return path for wire 30 during TDR testing. Conversely, if wire 32 is used for TDR testing and wire 30 is held to a static voltage, then wire 30 can operate as the return path for wire 32 during TDR testing.

Figure 5:
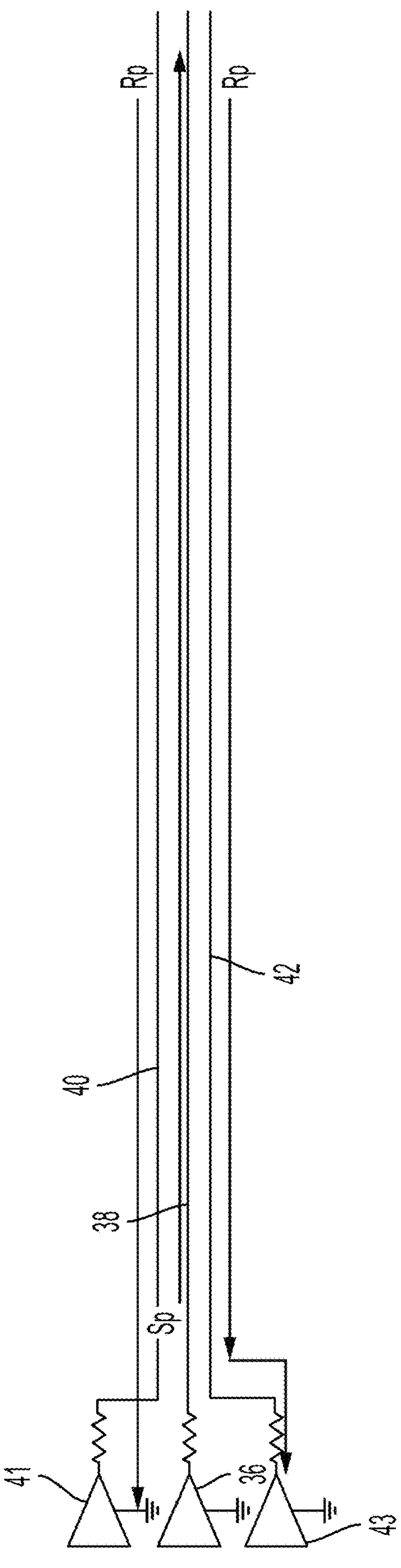
FIG. 5 is a block diagram of example transmission lines, with two transmission lines functioning as return paths for the other, third transmission line.

As show in FIG. 5, driver 36 may be used to generate a TDR signal that is applied to wire 38. Wires 40, 42 are held to a static voltage by drivers 41, 43. Wires 40, 42 function as multiple return path(s), which lower the impedance to ground relative to the implementation of FIG. 4. Since the wires are bundled and the ATE can activate the TDR channel and the return path channels independently, false positive faults may be reduced as the behavior of the wires approaches a uniform transmission line. As a bundle of wires moves together, so do the signal wires and the return path wires.

Figure 6:
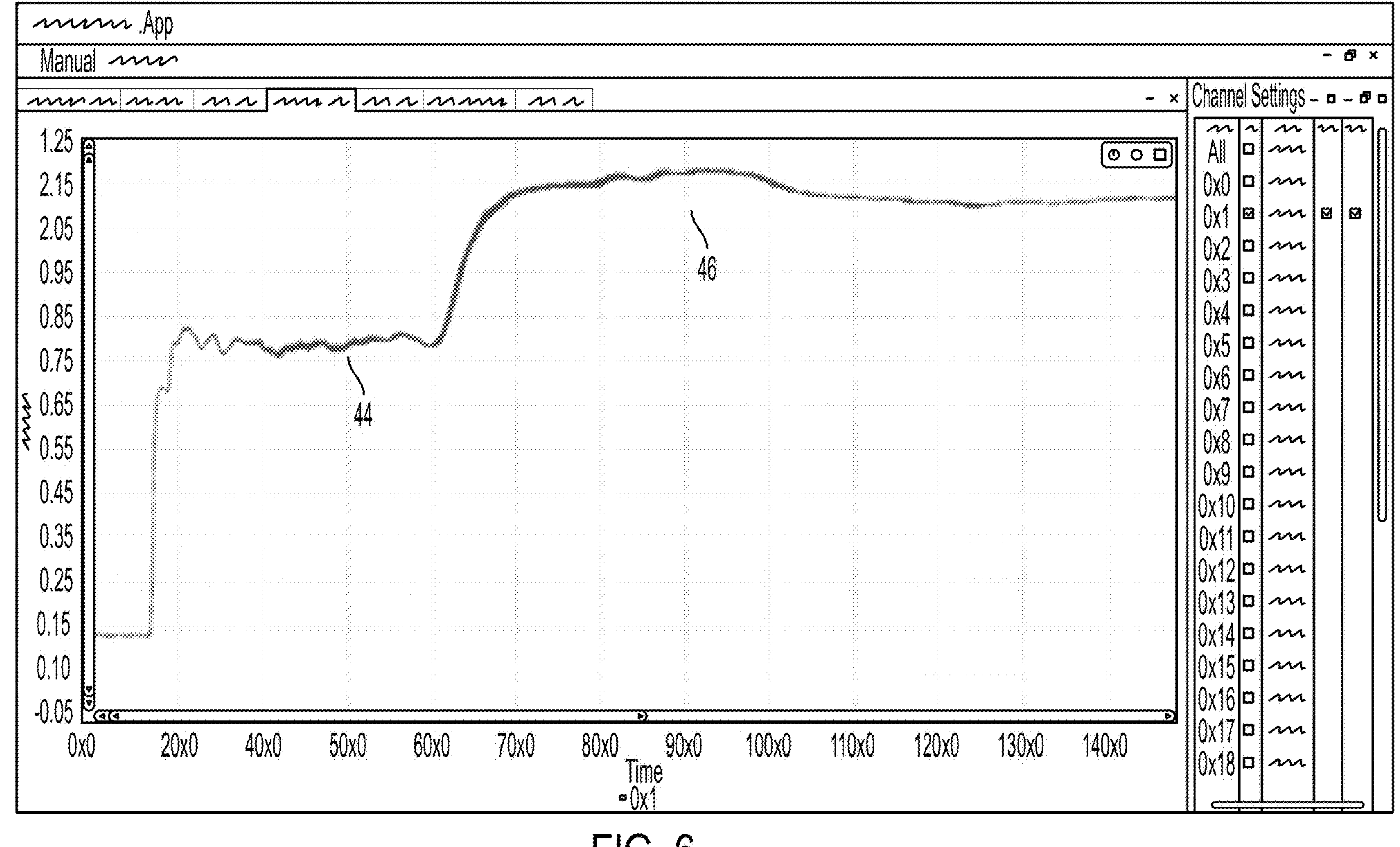
FIG. 6 is a graph showing example results of time domain reflectometry (TDR) testing using a known return path.
Figure 7:
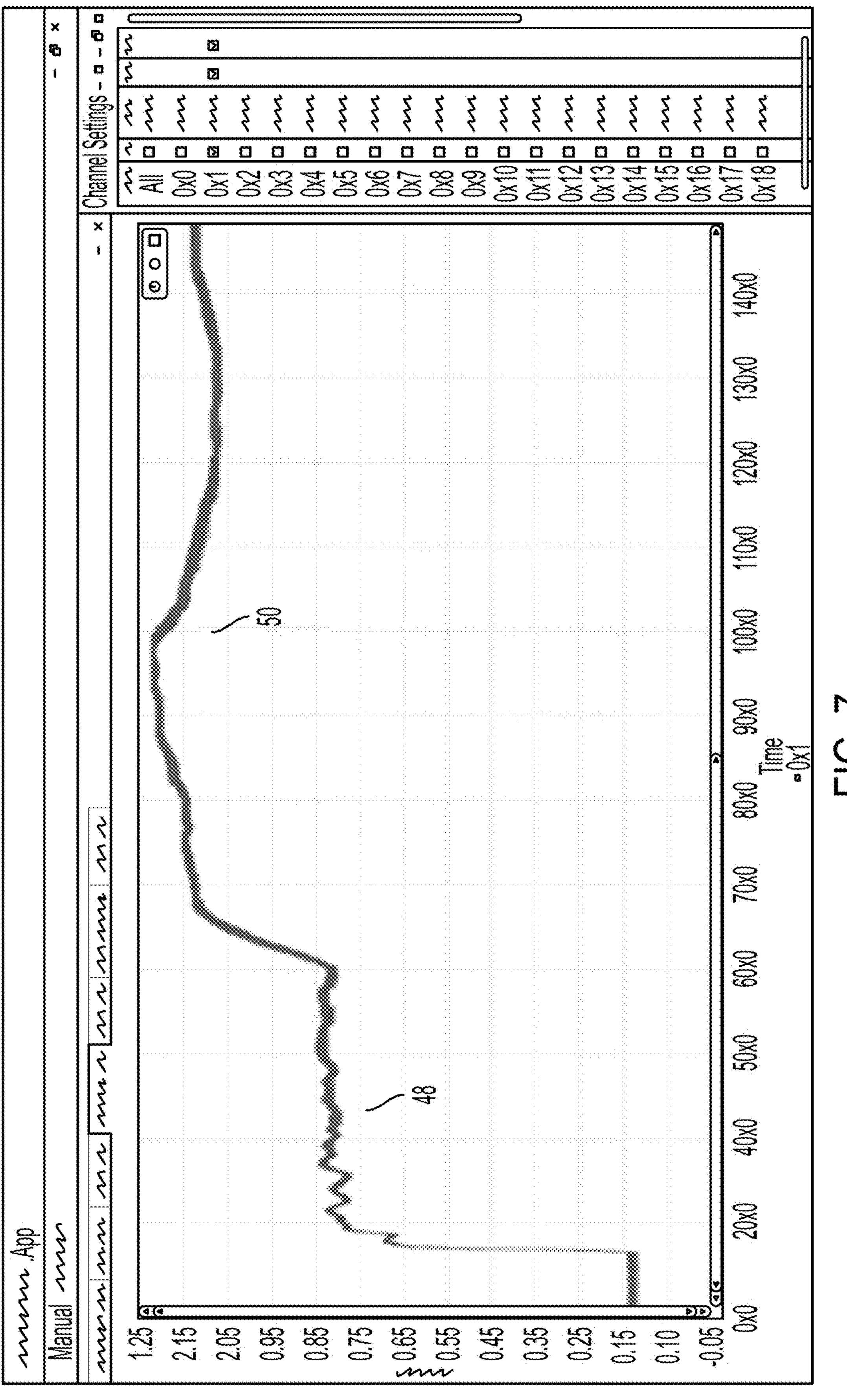
FIG. 7 is a graph showing example results of TDR testing absent a known return path.

FIGS. 6 and 7 are graphs illustrating potential benefits of identifying wires as potential return path(s) for a target wire being tested and configuring those wires as return path(s) for the target wire. FIG. 6 shows TDR test results for a test channel having return path(s) configured according to the techniques described herein. FIG. 7 shows TDR test results for a test channel having no return paths configured according to the techniques described herein. Specifically, FIG. 6 shows TDR test results produced by driving a signal on a channel #1 with all other channels in a bundle of wires configured as return path channels. The graph shows voltage persistence for channel #1 over two captures, one with cables straight and one with cables spooled-up. FIG. 7 shows TDR test results produced by driving a signal on channel #1 with no return path channels configured. The graph shows voltage persistence for channel #1 over two captures, one with cables straight and one with cables spooled up. As shown particularly in regions 44, 46 of FIG. 6, there is less variation in the TDR test results in FIG. 6 than in corresponding regions 48, 50 of FIG. 7. The variation in TDR test results is depicted by thickness in the line on the graph. The thicker the line, the more the TDR test results have varied/changed from TDR test to TDR test, e.g., run-to-run.

Figure 22:
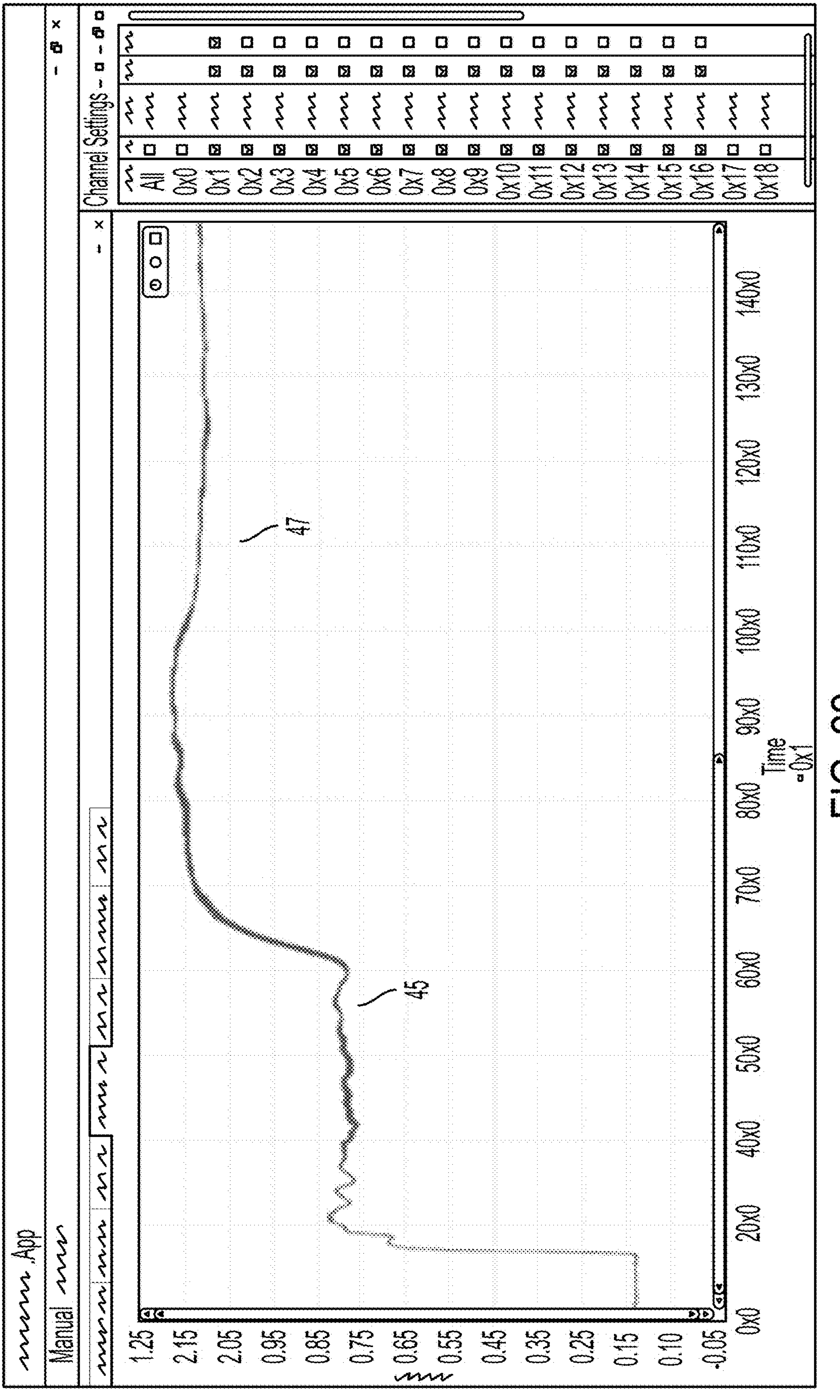
FIG. 22 is a graph showing example results of TDR testing using a known return path.
Figure 23:
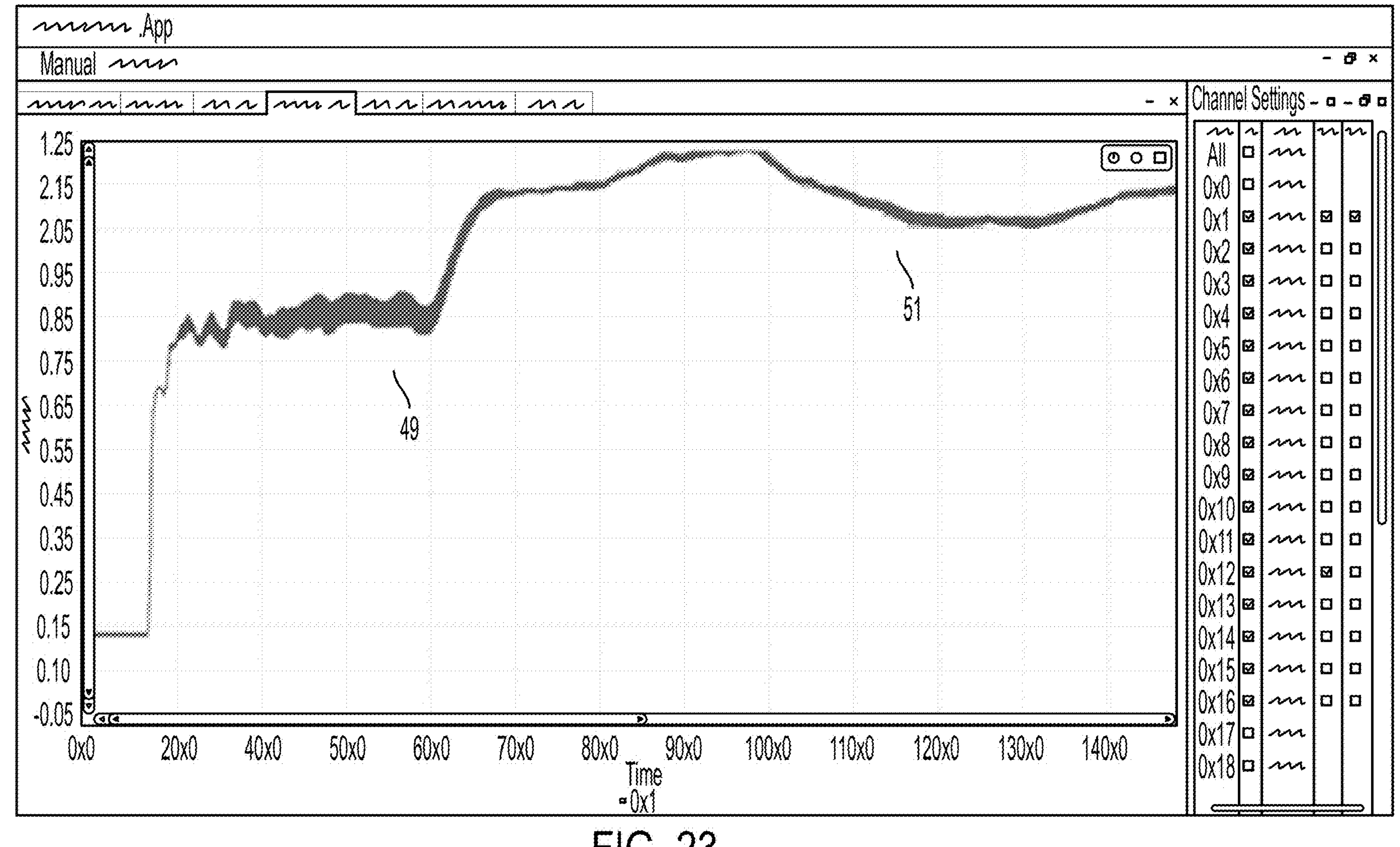
FIG. 23 is a graph showing example results of TDR testing absent a known return path.

FIGS. 22 and 23 are also graphs illustrating potential benefits of identifying wires as potential return path(s) for a target wire being tested and configuring those wires as return path(s) for the target wire. FIGS. 22 and 23 show multiple bundles being tested at the same time, unlike FIGS. 6 and 7. FIG. 22 shows TDR test results for a test channel having return path(s) configured according to the techniques described herein. FIG. 7 shows TDR test results for a test channel having no return paths configured according to the techniques described herein. Specifically, FIG. 22 shows TDR test results produced by driving signals on channel #1 and #2 with all other channels in a bundle of wires configured as return path channels. The graph shows voltage persistence for channels #1 and #2 over two captures, one with cables straight and one with cables spooled-up. FIG. 23 shows driving signals on channels #1 and #2 with no return path channels configured. The graph shows voltage persistence for channels #1 and #2 over two captures, one with cables straight and one with cables spooled up. As shown particularly in regions 45, 47 of FIG. 22, there is less variation in the TDR test results in FIG. 22 than in corresponding regions 49, 51 of FIG. 23.

As illustrated above, performing TDR testing using known return paths may be less prone to inaccurate fault detection. Furthermore, performing TDR testing absent known return paths may be more likely to produce variations from test to test, which may result in inaccurate detection of intermittent faults, such as false positives. Performing TDR testing using know return paths may make such false positives less likely.

Figure 8:
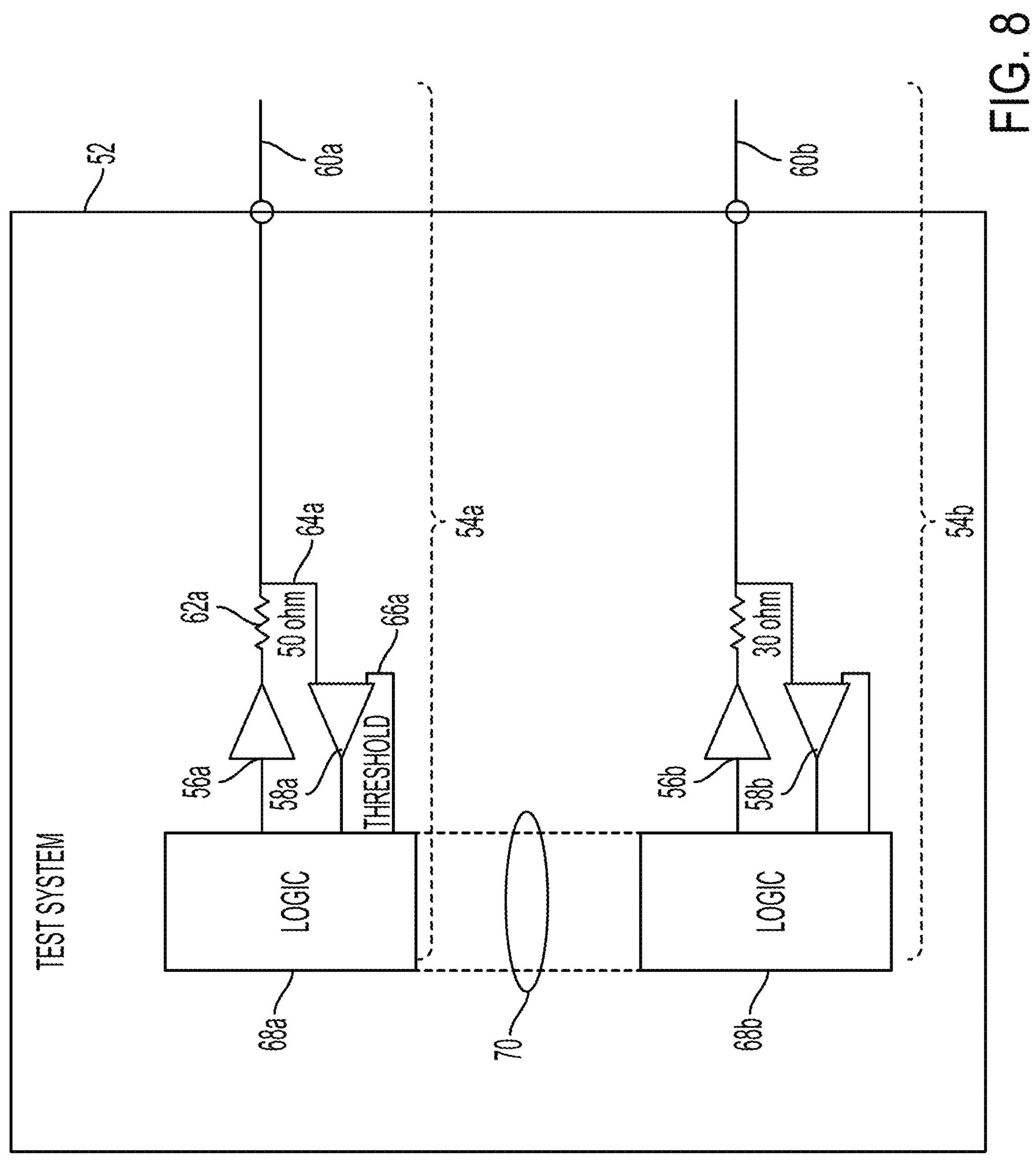
FIG. 8 is a block diagram of example components of an example test system on which all or part of the example processes described herein may be implemented.

FIG. 8 shows an example configuration of a test system 52 on which the techniques described herein may be implemented. However, it is noted that the techniques described herein are not limited to use on the test system of FIG. 8.

FIG. 8 shows two different test channels 54*a* and 54*b* of the test system, with each of these channels having an identical structure and function. Accordingly, only channel 54*a* is described in detail. Although only two channels 54*a*, 54*b* are shown, there may be hundreds or thousands of such channels in a system on which the processes may be performed. The channels may be single-ended or differential.

As shown in FIG. 8, example test channel 54*a* includes a driver circuit 56*a* and a receiver circuit 58*a*. Driver circuit 56*a* includes any electronic device, such as a voltage and/or current output device, configured to output electrical signals. Driver circuit 56*a* is controllable, e.g., by a control system (see, e.g., control system 126 of FIG. 21) of test system 52, to electrically connect to, and to disconnect from, a wire, such as transmission line 60*a*. Transmission line 60*a* can electrically couple through a physical switch, or be enabling the driver from a tri-state condition or any other methods. For example, test channel 54*a* may contain a switch (not shown) or other circuitry between driver circuit 56*a* and transmission line 60*a*. This switch or other circuitry my be controlled, e.g., by the control system of the test system. In another example, driver circuit 56*a* may be turned-on to electrically connect to transmission line 60 or turned-off to electrically disconnect from transmission line 60. Turning the driver circuit on or off may be controlled, e.g., by the control system. When driver 56*a* is electrically connected to transmission line 60, driver 56*a* is controllable, e.g., by the control system, to output an electrical signal to transmission line 56*a*. The electrical signal is output through resistor 62*a* in this example.

Receiver circuit 58*a* is configured to receive an electrical signal from transmission line 60*a* via branch 64*a*. Branch 64*a* includes no impedance-producing elements in this example. As a result, electrical signals, or at least the majority thereof, pass to receiver circuit 58*a*, rather than back into driver circuit 56*a*. Receiver circuit 58*a* may be configured to implement, or be part of, a detector that includes a comparator configured to compare one or more attributes an electrical signal from transmission line 60*a* to one or more predefined thresholds. For example, the detector may compare incident and reflected edges of an incident electrical signal and/or a reflected electrical signal to a threshold as part of TDR testing. For example, the detector may compare amounts of crosstalk to a predefined threshold. The predefined threshold may be absolute or based on the crosstalk presented by channels within a bundle of wires. For example, it may be determined that example channels #2 and #6 present more crosstalk to channel #1 than the other channels. Those channels #2 and #6 may be selected to be used as return paths even though the crosstalk threshold is undefined.

During TDR testing, driver circuit 56*a* is electrically connected to transmission line 60 and is configured to output electrical signals such as signal edges or pulses to transmission line 60*a*. During TDR testing, receiver circuit 58*a* is configured to receive a signal, such as an incident edge of the electrical signal, a reflected edge of the electrical signal, or a combination of incident and reflected edges from transmission line 60*a* via branch 64*a*. Receiver circuit 58*a* is configured compare incident and reflected edges to a threshold 66*a* to detect information about the incident and/or reflected waveform, e.g., to identify edges thereof. The timings of the incident and reflected edges may be processed by logic 68*a*, test instrument, 52 or a control system to identify a location of the reflection and, thus, one or more attributes of transmission line 60*a*.

Logic 68*a*, such as a field programmable gate array (FPGA), is configured to set threshold 66*a* for receiver circuit 58*a* that is used to compare incident and reflected edges to the threshold to identify those edges. For example, a test program may be loaded into the test system. The test program may contain thresholds that are to be programmed into logic 68*a* to enable the example TDR testing and/or crosstalk detection described herein. Firmware may be programmed into the logic to perform specific test operations. For example an application—which is another term for logic firmware—may be programmed into the logic to perform testing functionality and another application may be programmed into the logic to enable the logic and corresponding memory to capture TDR data as part of transmission line TDR analyses. Each channel may have its own logic 68*a*, 68*b* or the channels 54*a*, 54*b* may share logic as represented by dashed lines 70. In some implementations different test channels may have different combinations of multiple transmitter and multiple receivers.

In some implementations, prior to TDR testing, test system 52 identifies one or more return paths for transmission line 60*a*. For example, transmission line 60*b*, which may be part of the same wire bundle of wires as transmission line 60*a*, may be identified as, and designated as, a return path for transmission line 60*a*. To identify transmission line 60*b* as a return path for transmission line 60*a*, driver circuit 56*a* of channel 54*a* is controlled to electrically connect to transmission line 60*a* and driver circuit 54*a* is controlled to output a signal, such as the signal edges or pulses used during TDR testing, to transmission line 60*a*. Driver circuit 56*b* of channel 54*b* is controlled to electrically connect to transmission line 60*b* and driver circuit 56*b* is controlled to output a static voltage, also referred to herein as a reference voltage, such as a direct current (DC) voltage (e.g., ground voltage or a positive or negative DC voltage), to transmission line 60*b*.

Receiver circuit 58*b* receives a signal from transmission line 60*b*. The received signal constitutes crosstalk resulting from the signal output to transmission line 60*a* and the wireless coupling of transmission lines 60*a* and 60*b* described with respect to FIG. 1. Receiver circuit 58*b* compares the amount of crosstalk on transmission line 60*b* from transmission line 60*a* to a predefined threshold. The amount may be quantified, for example, based on the amplitude of the crosstalk signals. Receiver circuit 58*b* may output a signal when the amount of crosstalk on transmission line 60*b* from transmission line 60*a* exceeds the predefined threshold. Logic 68*b*, test instrument 52, or the control system may identify transmission line 60*b* as a return path for transmission line 60*a* when the amount of crosstalk is greater than the predefined threshold. This information may be stored in memory on logic 68*b*, test instrument 52, or the control system for future use. For example, during TDR testing, test instrument 52 or the control system may consult this memory to determine which transmission lines to use as return paths when a TDR test is to be performed for transmission line 60*a*.

In some implementations, each transmission line in a bundle of wires may be processed in this manner. For example, the driver circuit of a target transmission line may be electrically connected to the target transmission line and controlled to output a signal, such as the signal edges or pulses used during TDR testing. Each driver circuit of all other transmission lines in the bundle of wires may be electrically connected to their respective transmission lines and controlled to output a voltage, such as a DC voltage, to their respective transmission lines. Then, in the manner described above, one or more return paths may be identified for the target transmission line. This process may be repeated with each transmission line being designated, in turn, as the target transmission line. A mapping, which may be stored in memory as described above, thus may be generated for a bundle of wires. The mapping may specify, for each transmission line in the bundle, which other transmission lines can be configured to operate as return paths during testing, such as TDR testing.

Figure 24:
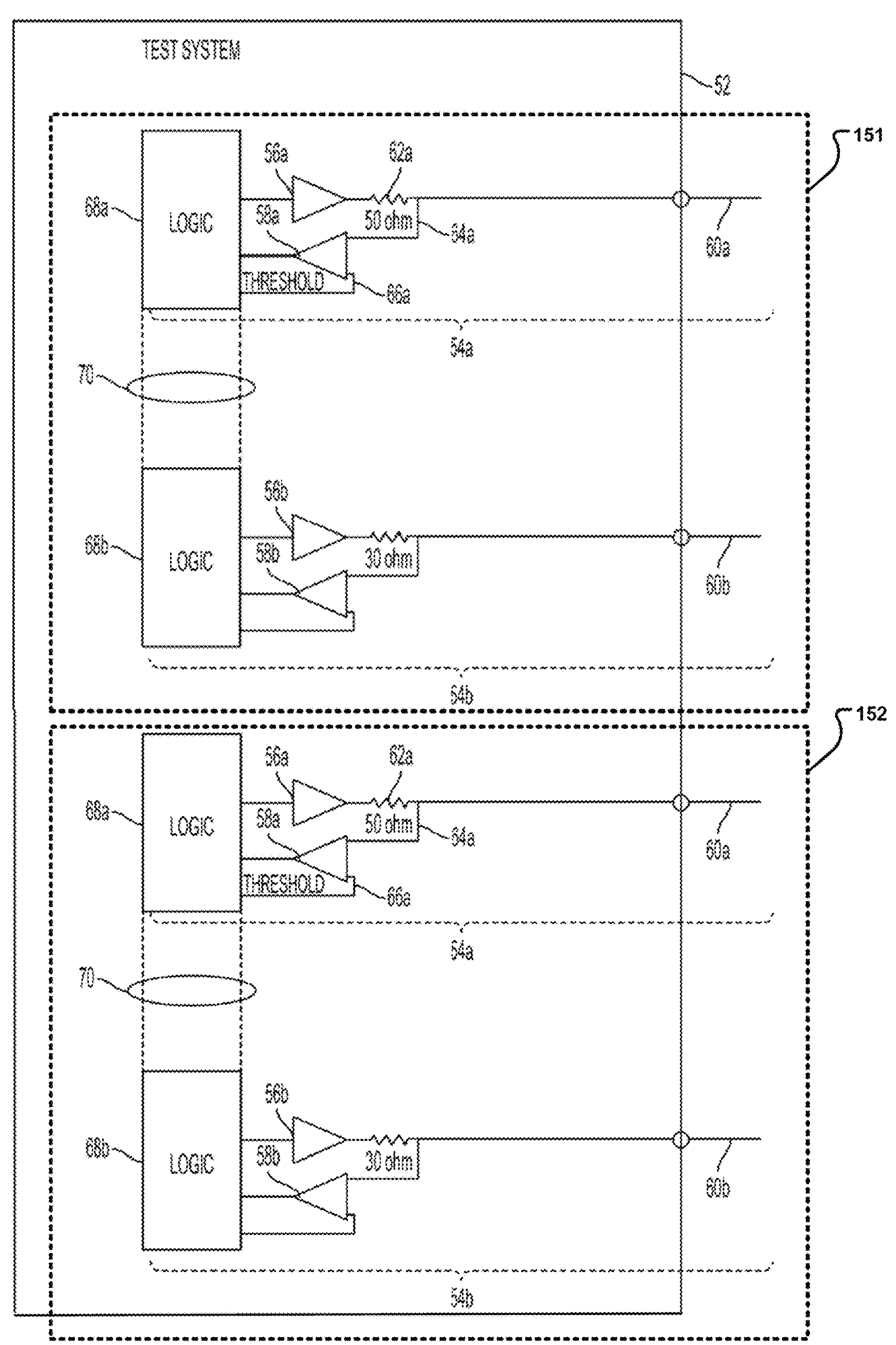
FIG. 24 is a block diagram of example components of an example test system on which all or part of the example processes described herein may be implemented.

FIG. 24 shows a variant of the test system of FIG. 8, which contains two instances 151 and 152 of the circuitry shown in FIG. 8. Instance 152 includes a third wire; a fourth wire; a third driver that is electrically connectable to, and electrically disconnectable from, the third wire; and a fourth driver that is electrically connectable, and electrically disconnectable from, the fourth wire.

Figure 9:
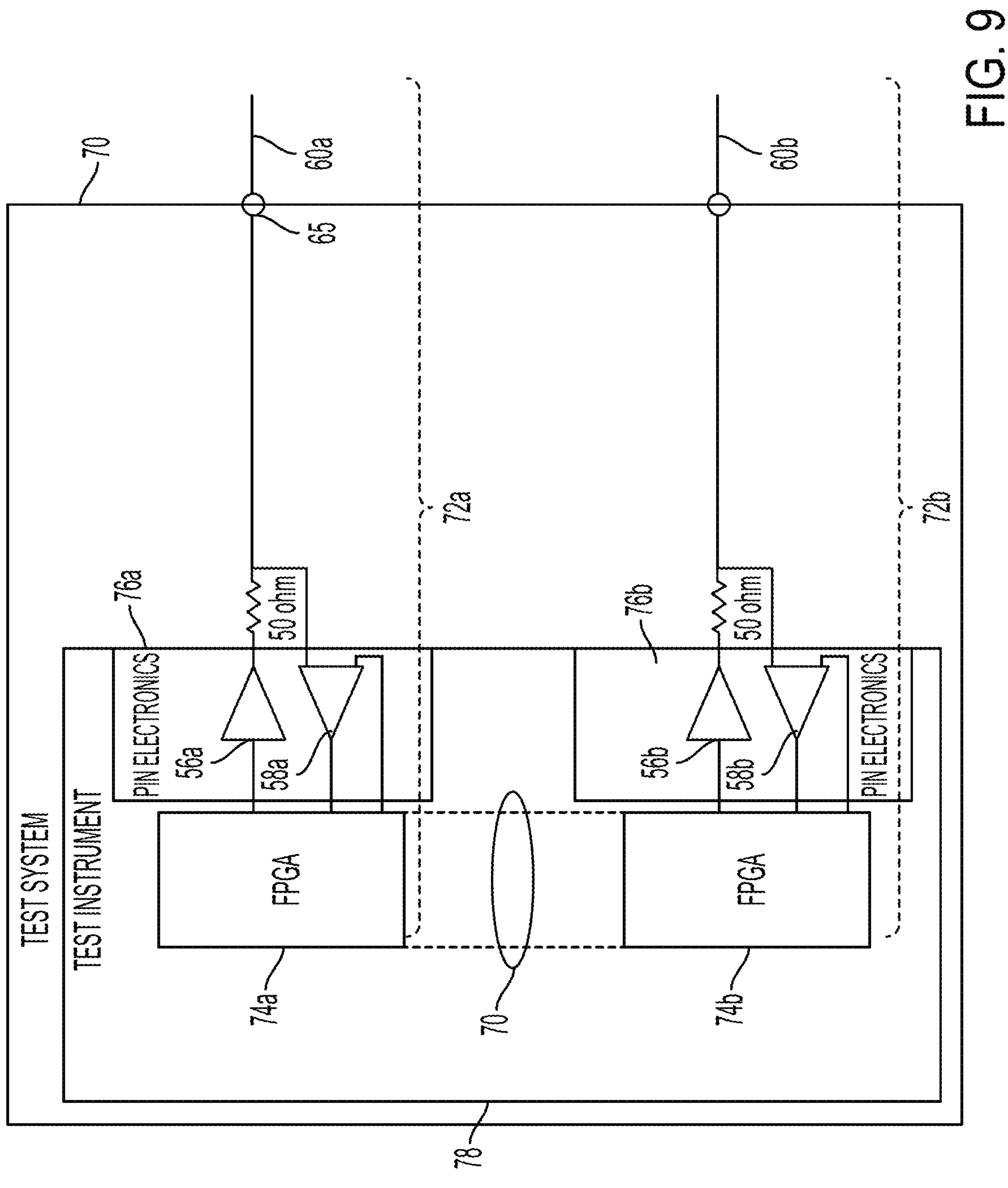
FIG. 9 is a block diagram of example components of an example test system on which all or part of the example processes described herein may be implemented.

FIG. 9 shows a variant of the test system of FIG. 8. Elements of FIG. 9 having the same reference numerals as corresponding elements of FIG. 8 indicate that both elements have the same structure and function. FIG. 9 shows two different test channels 72*a* and 72*b* of test system 70, each having an identical structure and function. Accordingly, only channel 72*a* is described in detail. Although only two channels 72*a*, 72*b* are shown, there may be hundreds or thousands of such channels in a system. The channels may be single-ended or differential.

In example test system 70, the logic of test system 52 (FIG. 8) is FPGA 74*a*. FPGA 74*a* may interface to the test system's pin electronics 76*a*. Example pin electronics 76*a* includes electronic circuitry that communicates with one or more pins on a DUT via transmission line 60*a*. The electronic circuitry may be analog, but that is not a requirement. The pin electronics can deliver signals, power, voltages, and/or currents to a DUT pin, and can measure a DUT's response, including electrical characteristics of the delivered signals, power, voltages, and/or currents. The signals may be AC (alternating current) or DC (direct current). Pin electronics 22 may be configured—for example, programmed, controlled by, or operated with the FPGA—to function as a detector circuit or as part of a detector circuit by performing TDR and crosstalk determinations in bundles of wires using the techniques described herein. Pin electronics 22 may also be used in determining the return paths for various wires using the techniques described herein. In this regard, the pin electronics includes driver circuit 56*a* and receiver circuit 58*a*, which are described above. In some implementations, other programmable circuitry may be used instead of, or in addition to, FPGA 74*a*, such as a programmable logic device (CPLD) or a programmable logic array.

Pin electronics 76*a* and 76*b* are part of a test instrument 78 of the test system. Although only one test instrument 78 is shown in FIG. 9, test system 70 may include one or more other test instruments (not shown) to test different types of devices under test (DUTs). Examples of specialized test instruments include RF test instruments, digital test instruments, and analog test instruments. Test instrument 78 is a hardware device configured to send test signals, such as AC signals, DC signals, and/or radio frequency (RF) signals over transmission line 60*a* to a DUT for testing. The DUT may reply with, or transmit, response signals that are responsive to these test signals back over transmission line 60*a*. Test instrument 78 expects the response signals to contain certain values and/or to have a certain timing, for example. If the response signals have the appropriate values and/or timing, the DUT may pass testing. If the response signals do not have those values and/or timing, then the DUT may fail testing.

The techniques described herein may be used to test the transmission line between the test system and DUT or the connection between the transmission line and the DUT. Accordingly, in some implementations, the device being tested may be the transmission line only, a segment of the transmission line only, a connection between the transmission line and the DUT, or the entirety of the connection between the test system the DUT including the DUT and the transmission line. Example test conditions include when active components on the DUT are either powered down or disconnected from the transmission path between the test system and the DUT.

As noted, a test system 52, 70 may be configured to perform one or more types of TDR testing. Example TDR testing includes outputting an electrical signal containing an incident edge onto a transmission line, measuring the incident edge and a reflection of the incident edge on the transmission line, and determining a signal path length based on a difference between the two measurements. TDR testing may be used to identify short circuits, open circuits, or other attributes of a transmission line, such as impedances along the transmission line. U.S. Pat. No. 4,734,637, titled "Apparatus For Measuring The Length Of An Electrical Line", describes an example TDR implementation that may be performed by test system 52, 70. The contents of U.S. Pat. No. 4,734,637 relating to its example TDR implementation are incorporated herein by reference. TDR may be performed while a DUT is off; that is, not operational.

A test system 52, 70 may be configured to perform spread spectrum time domain reflectometry (SSTDR) testing. Example SSTDR works by sending a stream of electrical signal ones and zeros, waiting for reflected ones and zeros, and performing autocorrelation to determine a location of a fault. Stated otherwise, SSTDR outputs spread spectrum electrical signals onto a transmission line and waits for those signals to be reflected back to the test system. Autocorrelation may be used to determine characteristics of the transmission line. Mathematical algorithms may be applied to both the shape and timing of the signals to locate, e.g., a short or an open circuit on the transmission line or other attribute of the transmission line. U.S. Pat. No. 10,504,307, titled "System And Method For Spread-Spectrum Time-Domain Reflectometry And Design Data Wire Testing", describes an example SSTDR implementation that may be performed by the test system. The contents of U.S. Pat. No. 10,504,307 relating to its example SSTDR implementation are incorporated herein by reference. An example SSTDR implementation that may be performed by the test system is also described in Reis, et al, "Sequence and Spread Spectrum Time Domain Reflectometry for Transmission Line Analysis", Conference: Proceedings of SPIE (September 2007), the contents of which are incorporated herein by reference.

SSTDR can be executed when a DUT is on, so SSTDR can be used to continuously, periodically, or intermittently monitor a transmission line for intermittent faults in a device over long periods of time. For SSTDR, the transmitted signal may be a very slow, low-frequency signal relative to existing signals on the transmission line as to not interfere with the existing signals on the transmission line. SSTDR may also be particularly suited to operation over a power line that operates at low frequencies.

A test system 52, 70 may be configured to perform sequence time domain reflectometry (STDR) testing. Example STDR includes generating a sequence signal and transmitting the sequence signal over the transmission line. The test system receives one or more reflection signals over the transmission line and performs reflection signal processing on the reflection signals to locate, e.g., a short or an open circuit on the transmission line or other attribute of the transmission line. U.S. Pat. No. 6,885,954 titled "Sequence Time Domain Reflectometry Using Complementary Golay Codes" describes an example STDR implementation that may be performed by the test system. The contents of U.S. Pat. No. 6,885,954 relating to its example STDR implementation are incorporated herein by reference. An example STDR implementation that may be performed by ATE 116 is also described in Reis, et al, "Sequence and Spread Spectrum Time Domain Reflectometry for Transmission Line Analysis", Conference: Proceedings of SPIE (September 2007), the contents of which are incorporated by reference above.

Test system 70 may be configured to perform the TDR testing described with respect to FIG. 19 below.

The techniques described herein may be used to determine return paths for any type of TDR testing including, but not limited to, those described herein.

Figure 10:
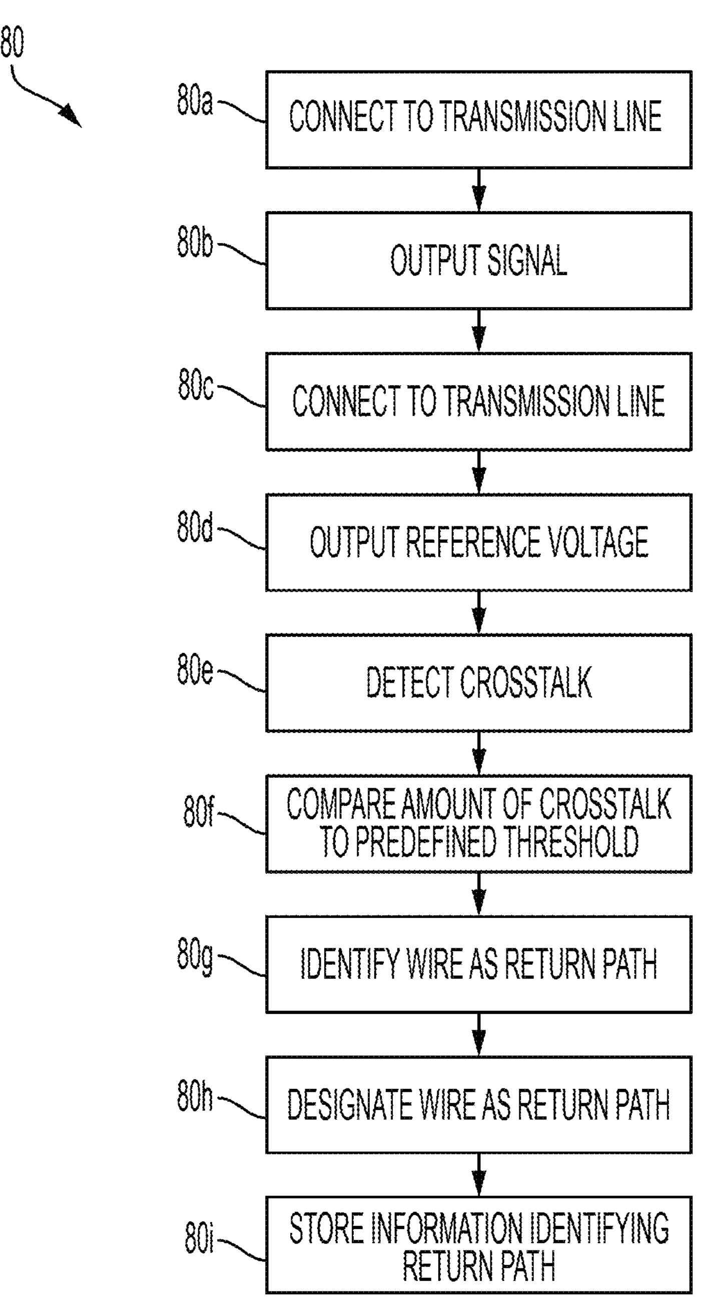
FIG. 10 is a flowchart showing example operations included in an example process for identifying return paths for a wire, such as a transmission line.

FIG. 10 is a flowchart showing example operations of an example process 80 for identifying return paths in a bundle of wires. The bundle of wires in this example include transmission lines 60*a* and 60*b* of FIG. 8 or 9. However, the techniques described herein may be used with any bundle of wires. Process 80 may be controlled by a test instrument and/or a control system such as those described herein.

Referring to the example test channels 54*a*, 54*b* of FIG. 8, process 80 includes controlling (80*a*) driver circuit 56*a* to electrically connect to transmission line 60*a* and to output (80*b*) a signal to transmission line 60*a*. The signal may be a TDR signal of the type described herein or an alternating current (AC) signal, for example.

Process 80 includes controlling driver circuit 56*b* to electrically connect (80*c*) to transmission line 60*b* and to output (80*d*) a reference voltage to the transmission line 60*b*. The reference voltage may be a DC signal, such as a positive or negative DC signal or ground voltage. Operations 80*c* and 80*d* may be repeated for all other wires in the bundle or for a subset of one or more of wires in the bundle. The subset may be based, for example, physical proximity to transmission line 60*a* if such information is known. For example, the system may include multiple other drivers that are electrically connectable to, and electrically disconnectable from, respective multiple other wires. Process 80 may control those multiple other drivers to electrically connect to respective one of the multiple other wires and control those multiple other drivers to each drive the reference voltage to their connected transmission lines.

Process 80 detects (80*e*) crosstalk from transmission line 60*a* on each of the transmission lines, including transmission line 60*b*, to which the reference voltage has been applied. The crosstalk is known to come from transmission line 60*a* because, in this example, that is the only wire to which a signal such as a TDR signal or an AC signal has been applied. This detection process may be performed by the receiver of each wire to which the reference voltage has been applied, such as receiver circuit 58*b*.

For each wire on which crosstalk is detected, process 80 compares (80*f*) the amount of detected crosstalk to a predefined threshold. The comparison may be performed by receiver circuit 58*b*, logic 68*b*, FPGA 74*b*, test instrument 78, or the control system. The predefined threshold may be programmed into one or more of receiver circuit 58*b*, logic 68*b*, FPGA 74*b*, or test instrument 78 by the control system and may be based on attributes of the signal applied to transmission line 60*a*, such as an amplitude of the signal. For example, the greater the amplitude of that signal, the greater the predefined threshold may be. In some implementations, the predefined threshold may be set to 20% or more of an attribute of the signal on transmission line 60*a*, 15% or more of an attribute of the signal on transmission line 60*a*, 10% or more of an attribute of the signal on transmission line 60*a*, 5% or more of an attribute of the signal on transmission line 60*a*, 4% or more of an attribute of the signal on transmission line 60*a*, 3% or more of an attribute of the signal on transmission line 60*a*, 2% or more of an attribute of the signal on transmission line 60*a*, 1% or more of an attribute of the signal on transmission line 60*a*, or some other percentage other than these of an attribute of the signal on transmission line 60*a*.

As noted above, the predefined threshold may be absolute or based on the crosstalk presented by channels within a bundle of wires. For example, it may be determined that example channels #2 and #6 present more crosstalk to channel #1 than the other channels. Those channels #2 and #6 may be selected to be used as return paths even though the crosstalk threshold is undefined.

In each transmission line where the amount of crosstalk exceeds the predefined threshold or transmission line(s) are identified that provide the most crosstalk to transmission line 60*a*, process 80 identifies (80*g*) that transmission line (wire) as a return path for transmission line 60*a* and designates (60*h*) that transmission line (wire) as a return path for transmission line 60*a*. For example, if the amount of crosstalk on transmission line 60*b* exceeds the predefined threshold, then transmission line 60*b* is identified as a return path for transmission line 60*a* and is designated as such. Process stores (80*i*) this information—that is, an indication that transmission line 60*b* can be a return path for transmission line 60A—in memory in logic 68*a* and/or 68*b*, FPGA 74*a* and/or 74*b*, test instrument 78, and/or the control system.

In some implementations, each wire, such as transmission line 60*b*, identified as a return path for transmission line 60*a* is in physical proximity to transmission line 60*a* such that a characteristic impedance of transmission line 60*a* to transmission line 60*b* is 150Ω or less. In some implementations, each wire, such as transmission line 60*b*, identified as a return path for transmission line 60*a* is in physical proximity to transmission line 60*a* such that a characteristic impedance of transmission line 60*a* to transmission line 60*b* is 100Ω or less. In some implementations, each wire, such as transmission line 60*b*, identified as a return path for transmission line 60*a* is in physical proximity to transmission line 60*a* such that a characteristic impedance of transmission line 60*a* to transmission line 60*b* is any impedance between 40Ω and 150Ω inclusive. In some implementations, each wire, such as transmission line 60*b*, identified as a return path for transmission line 60*a* is in physical proximity to transmission line 60*a* such that a characteristic impedance of transmission line 60*a* to transmission line 60*b* is greater than 40Ω.

Operations 80*c* to 80*i* may be repeated multiple times until all wires to which the reference voltage have been applied are tested to determine whether they can be designated as return paths for transmission line 60*a*.

Process 80 may be repeated for each wire in a bundle, such as a bundle of wires including transmission lines 60*a* and 60*b*, until all wires in the bundle have been tested. That is, each wire may be tested by driving a TDR or AC signal thereto and determining return paths for that wire. The return paths for each wire in the bundle may be identified, designated, and stored in memory. Accordingly, process 80 may be repeated tens, hundreds, thousands, or more times.

Figures 11, 12, 13, 14, 15, 16, 17:
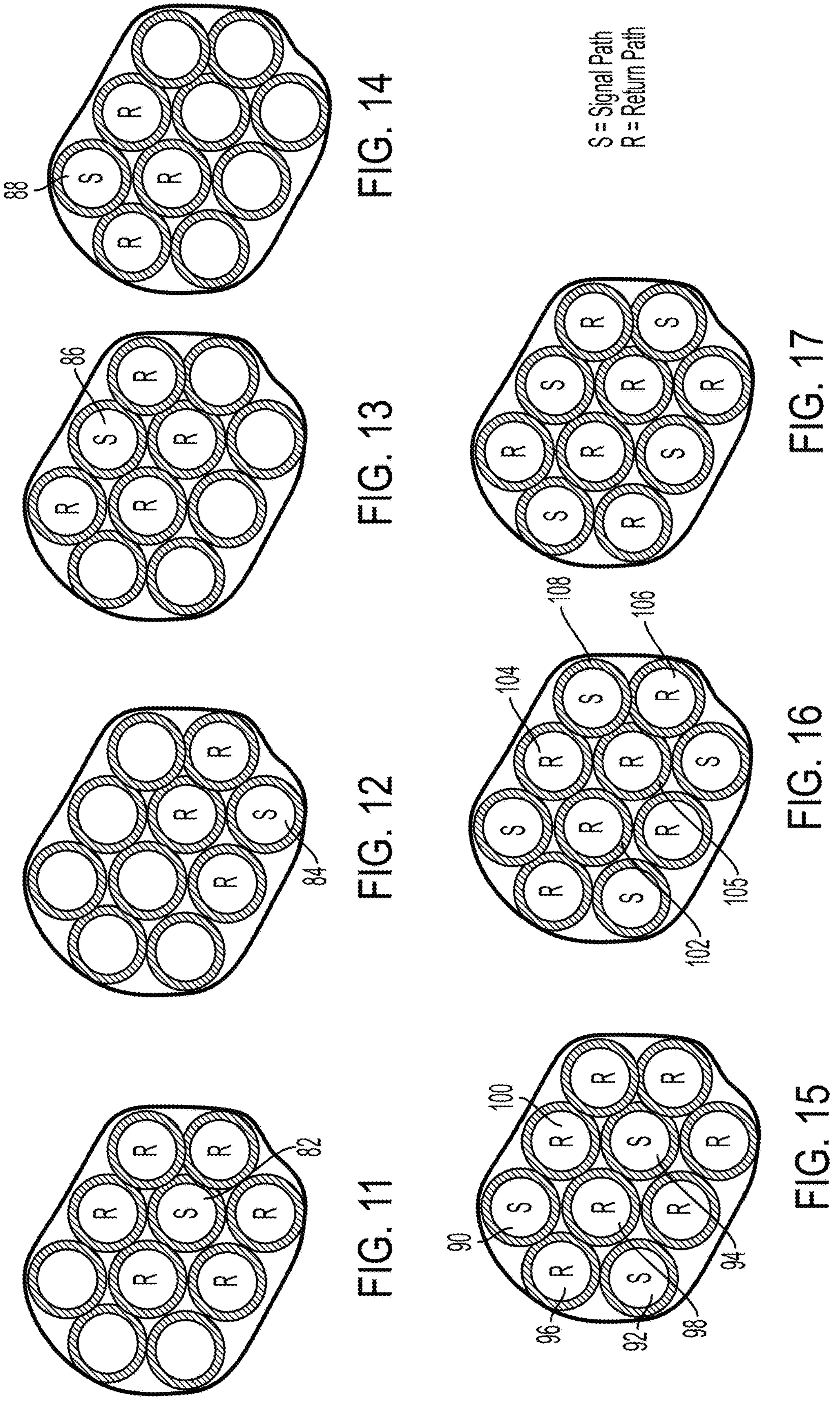
FIGS. 11 to 17 are cross-sectional views of different configurations of example bundles of wires with signal paths and return paths labeled.

FIGS. 11 to 17 show examples of cross-sections of bundles of wires with electrical insulation between individual wires. In FIGS. 11 to 17, "S" designates a wire as a signal path where TDR testing is to be performed and "R" designates a wire as a return path for one or more signal paths. The wires that function as return paths have been identified using process 80. In FIG. 11, wire 82 is surrounded by six return paths in a configuration similar to that of a coaxial cable. In FIG. 12, wire 84 is bordered by three return paths. In FIG. 13 wire 86 is bordered by four return paths. In FIG. 14, wire 88 is bordered by three return paths. In FIG. 15, wires 90, 92, 94 are each bordered or surrounded by return paths. In this example, wires 90, 92, 94 may share return paths. For example, wires 90 and 92 may share return paths 96 and 98, and wires 90 and 94 may share return paths 98 and 100, and so forth. That is, one wire may act as a return path for more than one signal path. The same is true for the example configurations of FIGS. 16 and 17, each of which shows multiple signal paths with shared return paths. Although the return paths shown in the figures are wires adjacent to wires that act as signal paths, this need not be the case. For example, in FIG. 16, wire 102, along with wires 104, 105, 106, may function as return paths for wire 108. In this example, the determining factor is the amount of crosstalk on the other wires. In this example, the amount of crosstalk on wire 102 from wire 108 exceeds the predefine threshold, making wire 102 a potential return path for wire 108.

Figure 18:
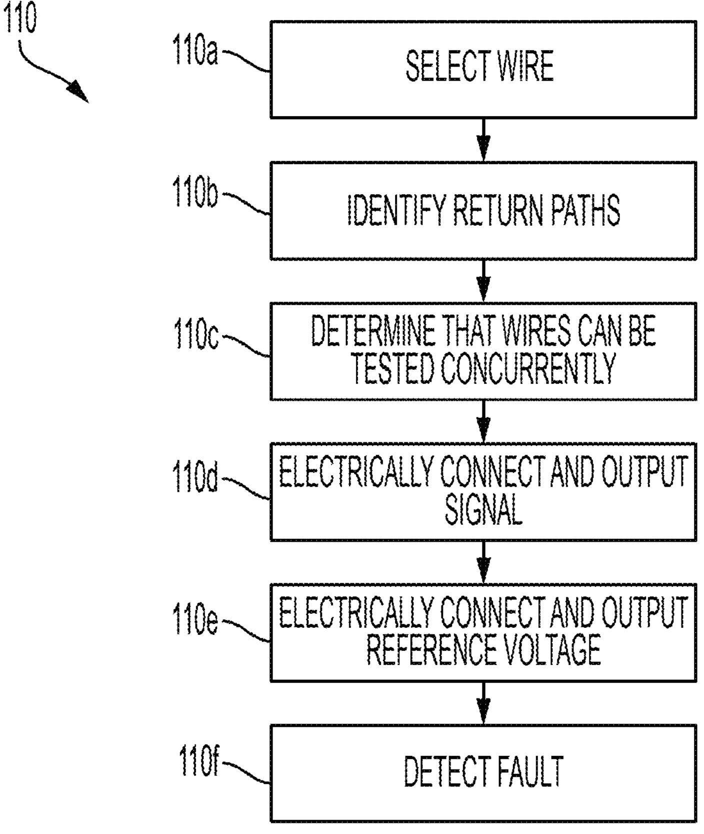
FIG. 18 is a flowchart showing example operations included in an example process for testing a wire, such as a transmission line.

FIG. 18 is a flowchart showing example operations in an example process 110 for testing wires in a bundle of wires using the return paths identified in process 80. Process 110 may be controlled by a test instrument and/or a control system such as those described herein.

Process 110 includes selecting (110*a*) one or more wires, such as transmission line 60*a*, on which to perform testing, such as TDR testing. Process 110 includes identifying (110*b*), in memory, which return paths are configured for the selected wire(s). If more than one wire has been selected to perform testing, process 110 determines (110*c*) whether those wires can be tested concurrently based on their designations as return paths. For example, referring to FIG. 15, wires 90 and 92 may both be selected to perform TDR testing concurrently, since they do not function as return paths for each other. By contrast, wires 90 and 100 may not both be selected to perform TDR testing concurrently, because wire 100 functions as a return path for wire 90 and vice versa (although not depicted). In this case, there is a conflict and both wires cannot be tested concurrently. One of the wires, therefore, is selected for testing for a current round of testing. The other wire may be selected in a subsequent round of testing.

For each wire selected for testing, process 110 includes controlling a driver such as driver 56*a* to electrically connect to the wire (e.g., a first wire such as transmission line 60*a*) and to output (110*d*) a signal to the first wire. For each return path for the first wire, process 110 includes controlling a driver such as driver 56*b* to electrically connect to the return path wire (e.g., transmission line 60*b*) and to output a reference voltage (110*e*) to the return path wire. Process 110 includes detecting (110*f*) a fault in the first wire based on a reflection of the signal on the first wire. Detection may be in accordance with any TDR test such as, but not limited to, those describe herein. Process 110 may be repeated over time using the same wires and the same signals to detect intermittent faults. Process 110 may be repeated for each wire in a bundle to perform TDR testing on each wire.

Figure 19:
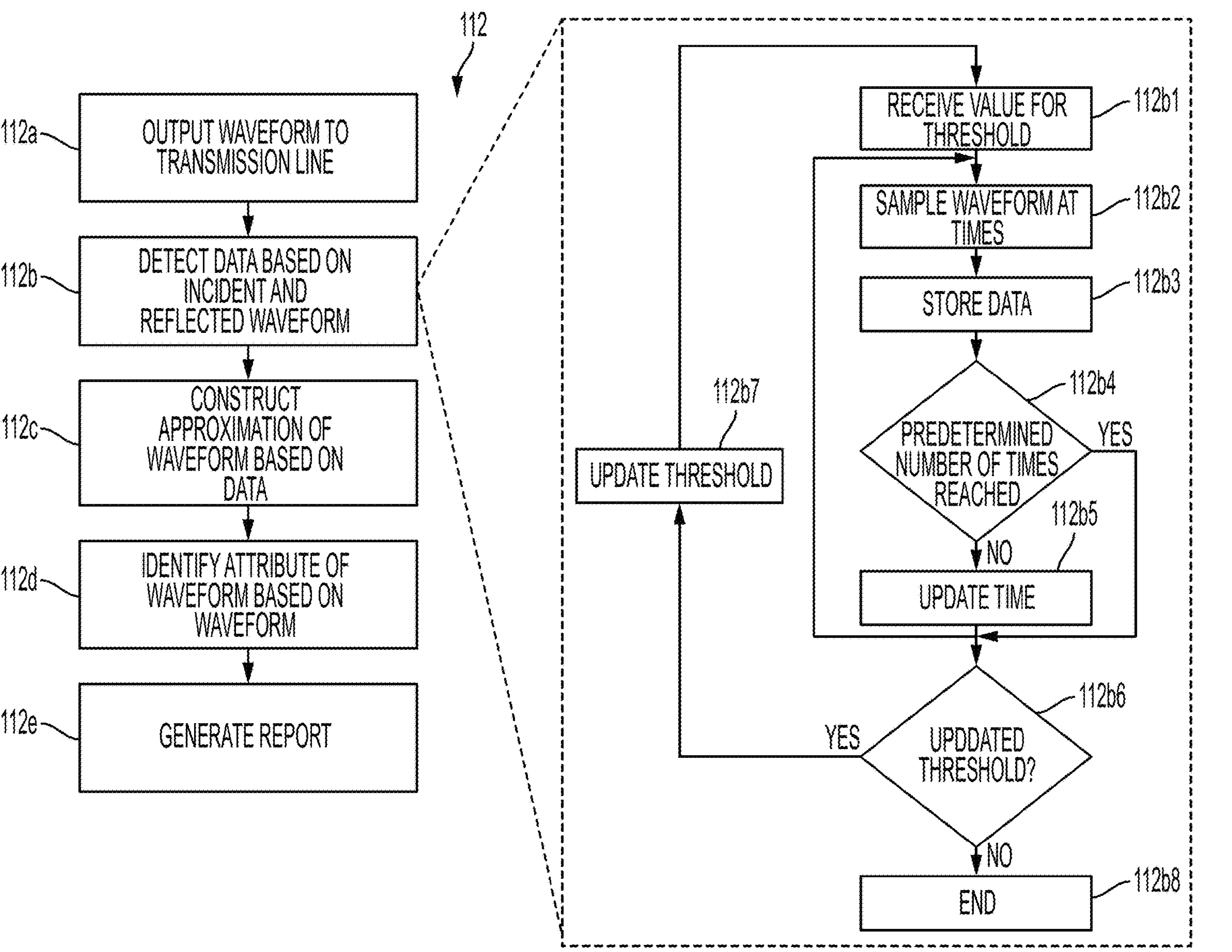
FIG. 19 is a flowchart showing example operations included in an example process for performing time TDR testing.

FIG. 19 shows example operations included in an example process 112 that may be used by process 110 for performing TDR testing to detect attributes of a transmission line, such as a change in impedance in the transmission line, one or more impedances on the transmission line, an electrical length of the transmission line or a segment of the transmission line, or open or short circuits in the transmission line.

In this example, process 112 may be performed on test system 70, although it is not limited to being performed on a test system having the configuration of test system 70. For process 112. FPGA 74*a* of test system 70 also includes hardware delay elements, which are hardware circuits such as time delay relays configured to add time delay into a circuit path. Each hardware delay element is configured—for example, designed, manufactured, and/or controllable—to provide a predefined amount delay. For example, each hardware delay element may provide the same amount of delay. In an example, each hardware delay element may provide a delay of 1/16 nanoseconds (ns) or more or less, such as 1/64 ns, 1/32 ns, 1/8 ns, 1/4 ns, 1/2 ns, and so forth. The examples described herein use delay elements that each introduces a time delay of 1/16 ns into a circuit path; however, time delay elements that introduce more or less time delay may be used in some examples.

Referring to FIG. 9, detecting open circuits may include determining the electrical distance (in units of time) from connector 65 on test system 70 to an end of the transmission line 60*a* that has an open circuit. This open circuit may happen at the end of the transmission line or at some point along the transmission line. A user may program, into test system 70, test limits or thresholds to determine if the open circuit is an expected open. The test limits or thresholds can be used with a captured waveform generated based on the capture data or on an interpretation of the captured waveform. The test system can interpret the captured waveform based on reflections to determine likely segments of the captured waveform containing impedance changes. These segments can then be individually tested against user-defined test limits.

Detecting short circuits may include determining the electrical distance (in units of time) from connector 65 on test system 70 to a short circuit in the transmission line, such as at an end thereof. The user may program, into test system 70, test limits or thresholds to determine if the short circuit is an expected short circuit.

In some implementations, process 112 may be controlled by a control system such as that described below and, in this example, may be implemented using pin electronics 76*a*, FPGA 74*a*, and/or other components of test system 70. Process 112 includes controlling driver circuit 56*a* to output (112*a*) a waveform onto transmission line 60*a*. The waveform may be an electrical signal as described herein having an incident edge. The incident edge may be positive edge or a negative edge.

Process 112 includes pin electronics 76*a* detecting (112*b*) data based on the incident and reflected waveforms. This operation may be implemented by receiver circuit 58*a* in pin electronics 76*a*. The receiver circuit is configured to scan the waveform across a range of times and across a range of voltages to obtain the data for the waveform. The times and voltages used in the following description are examples only and are used to illustrate process 112. Different times and/or voltages may be used by process 112.

Examples operations for detecting (112*b*) the data includes receiving (112*b*1) a voltage threshold against which the receiver circuit 58*a* compares received data. The threshold may be programmed into test system 70 by a user or test program; consequently, the threshold is software-based and can be set and reset to any value or values. The threshold may be, represent, or correspond to a voltage level, or increment thereof, against which data sampled from the transmission line 60*a* by receiver circuit 58*a* is compared. In an example, the threshold is 0.5 millivolts (mV).

Process 112 includes receiver circuit 58*a* detecting data from the transmission line by comparing the data to the threshold. The data that is detected is from the incident and/or reflected waveforms on transmission line 60*a*. If a voltage of the data exceeds the threshold, the data is detected. If a voltage of the data does not exceed the threshold, the data is not detected.

FPGA 74*a* samples (112*b*2) detected data from receiver circuit 58*a*—that is, the FPGA obtains the data from receiver circuit 58*a* that exceeds the voltage threshold. The FPGA may perform sampling at specified times in a predefined range (e.g., Ons (nanoseconds) to 256 ns), with each time being separated by a time period. The time period at which the data is sampled by the FPGA may be inherent to the FPGA or programmed into the FPGA by a user or test program, and the times at which sampling occurs may be set and changed by delay elements in the FPGA. By way of example, the time period that separates the times may be 1 ns, which may be the clock resolution for FPGA 20. The delay elements, however, enable sampling at a higher resolution than the clock resolution. For example, during a first round of sampling, FPGA 74*a* may sample data from receiver circuit 58*a* at Ons, 1 ns, 2 ns, . . . up to 255 ns. During a second round of sampling on the same waveform, a single delay element may be introduced into the FPGA sampling circuit path, which causes the FPGA to perform sampling a 1⁄16 ns, $1^{1/6}$ ns, $2^{1/6}$ ns, . . . up to $255^{1/6}$ ns. During a third round of sampling on the same waveform, two delay elements, may be introduced, then three delay elements in a fourth round, then four delay elements in a fifth round, up to fifteen delay elements in a sixteenth round. Notably, the delay elements during sampling rounds need not be introduced in sequence. For example, a first round of sampling may introduce twelve delay elements, a second round of sampling may introduce no delay elements, a third round of sampling may introduce two delay elements, and so forth until (in this example) sixteen rounds of sampling covering different numbers of delay elements in each round are performed.

Returning to focus on the first round of sampling, in this example, FPGA 74*a* samples data from receiver circuit 58*a* at Ons, 1 ns, 2 ns, . . . up to 256 ns. FPGA 74*a* stores (112*b*3) the sampled data in memory in the FPGA or elsewhere in association with the time at which each instance of sampled data (which may contain one or more bits of data) was sampled.

Process 112 determines (112*b*4) if a predetermined number of times has been reached for the present, same voltage threshold for the same waveform. The predetermined number of times may be based on the time range that the data is sampled over, the FPGA clock resolution, and the resolution of the delay elements. In the example presented herein, the data is sampled over 256 ns, the clock resolution is 1 ns, and the delay element resolution is 1⁄16 ns. So, in this example the predetermined number of times may be 16 samples for each of 256 ns, or 4096 samples. If 4096 samples have been collected, then the condition of operation 112*b*4 is satisfied.

In an alternative formulation, the predetermined number of times in operation 112*b*4 may be based on the number of delay elements introduced into the FPGA sampling circuit path for the present, same voltage threshold for the same waveform. For example, if all expected delay elements have been introduced into the FPGA sampling circuit path, then the condition of operation 112*b*4 is satisfied.

In any case, if the condition of operation 112*b*4 has not been satisfied, process 112 updates (112*b*5) the time at which the same voltage waveform is sampled at the present, same voltage threshold. This may be done by adding or removing delay elements 30 from the sampling circuit path of FPGA 74*a*. For ease of explanation, this example assumes initial sampling at the 1 ns clock resolution and that an additional delay element, having a delay of 1⁄16 ns, is introduced into the FPGA circuit path. Accordingly, in this example, updating the time causes FPGA 74*a* to perform sampling a 1⁄16 ns, $1^{1/6}$ ns, $2^{1/6}$ ns, . . . up to $255^{1/6}$ ns for the present, same voltage threshold and the same waveform. Operations 112*b*2 through 112*b*5 may be repeated to cause FPGA 74*a* to perform sampling at 2⁄16 ns, $1^{2/6}$ ns, 76*a*/$^{6}$ ns, . . . up to 25112/$^{6}$ ns for the present, same voltage threshold and the same waveform, to cause FPGA 74*a* to perform sampling at 3⁄16 ns, $1^{3/6}$ ns, $2^{3/6}$ ns, . . . up to $255^{3/6}$ ns for the present, same voltage threshold and the same waveform, to cause FPGA 74*a* to perform sampling at 4⁄16 ns, $14^{1/6}$ ns, $2^{4/6}$ ns, . . . up to $255^{4/6}$ ns for the present, same voltage threshold and the same waveform . . . and so forth up FPGA 74*a* performing sampling at 15⁄16 ns, $1^{15/6}$ ns, $2^{15/6}$ ns, . . . up to $255^{15/6}$ ns for the present, same voltage threshold and the same waveform. In this example, "to $255^{15/6}$ ns" represents a number of delays summed to reach the time period (256 ns) minus a single delay (1⁄16 ns). Thereafter, the condition at operation 112*b*4 is satisfied. In this example satisfying operation 112*b*4 means that all samples have been collected for the present, same voltage threshold and the same waveform. In some examples, the "same waveform" for subsequent samples may be a different instance of the waveform output for the first sample that is identical or substantially identical to the waveform output for the first sample. For example, the "same waveform" may include different instances of a waveform having the same shape, magnitude timing, and/or other characteristics output to the transmission line repeatedly.

Thereafter, process 112 process to operation 112*b*6, where it is determined whether to update the threshold 27. Determining whether the threshold is to be updated may include comparing a present threshold to a predefined maximum threshold. If the present threshold is less than the predefined maximum threshold, then the threshold is to be updated (112*b*7). If the present threshold is greater than the predefined maximum threshold, the threshold may not need to be updated. For example, each update to the threshold may include incrementing the threshold by 0.5 mV. In this example, the predefined maximum threshold may be 128 mV, which corresponds to 256 updates. If the present threshold is less than 128 mV, then the threshold is updated. Updating the threshold may include adding the threshold (in this example, 0.5 mV) to a present aggregated value for the threshold. If the present value for the threshold is 0.5 mV, updating the value for the threshold results in a threshold value of 1 mV; If the present value for the threshold is 1 mV, updating the value for the threshold results in a threshold value of 1.5 mV; if the present value for the threshold is 1.5 mV, updating the value for the threshold results in a threshold value of 2.0 mV . . . up to the predefined maximum value for the threshold of 128 mV. In some implementations, updating may not be sequential; rather, the 0.5 mV increments of the threshold may be processed in any appropriate order. For example, a first update may produce a threshold of 6.5 mV; a second update may produce a threshold of 2.5 mV; a third update may produced a threshold of 100.5 mV; and so forth so long as all possible 0.5 mV increments from 0 to 128 mV are accounted for. In any event, operations **112*b*1 through 112*b*7 are repeated a predetermined number of times, each time using an updated (112*b*7**) value for the threshold. In some implementations, the values of the threshold extend at least from a lowest voltage value of the waveform to a highest voltage value of the waveform. This range of thresholds ensures that all features of the waveform will be captured during scanning of the waveform across the range of voltages and times. A number of values of the threshold is typically less than or less than or equal to, a number of values for the time; however, in some implementations, a number of values of the threshold may be greater than or greater than or equal to a number of values for the times. The threshold may also extend into negative values in some examples.

In some implementations, the threshold sweep—for example, the processing from the minimum voltage threshold to the maximum voltage threshold—should at least cover a driver swing—for example, the range of voltages on a signal sent by the driver. For example, if the driver is sending a TDR edge from 0V to 1V, then the detector sweep should at least encompass those numbers for an example sweep from—e.g., from 0.25V to 1.25V in order capture the entire waveform during TDR testing. So, in this example, the range of thresholds exceeds the driver sweep.

In an example, assume a 0.5 mV increment, resulting in a first new threshold value of 1.0 mV. In this case, operations **112*b*1 to 112*b*7** are repeated until the 128 mV threshold value is reached and processed. By changing—for example, increasing the threshold progressively incrementally—the full range of voltages (for example, 0.5 mV to 128 mV) of the incident and reflected waveforms on the transmission line may be sampled. And, as noted above, for each threshold, the samples may be across the predefined range of times (for example, Ons to 256 ns). In this example, this results in 4096 samples for each of the 256 thresholds. This information defines the shape of the TDR waveform on the transmission line. As noted, in other examples, the range of voltages and the range of times may be different—for example, greater, less, different resolutions, and so forth—than the examples presented herein for illustration.

As shown in FIG. 19, if the maximum value of the threshold is reached (**112*b*6), the operation 112*b* ends (112*b*8**).

Figure 20:
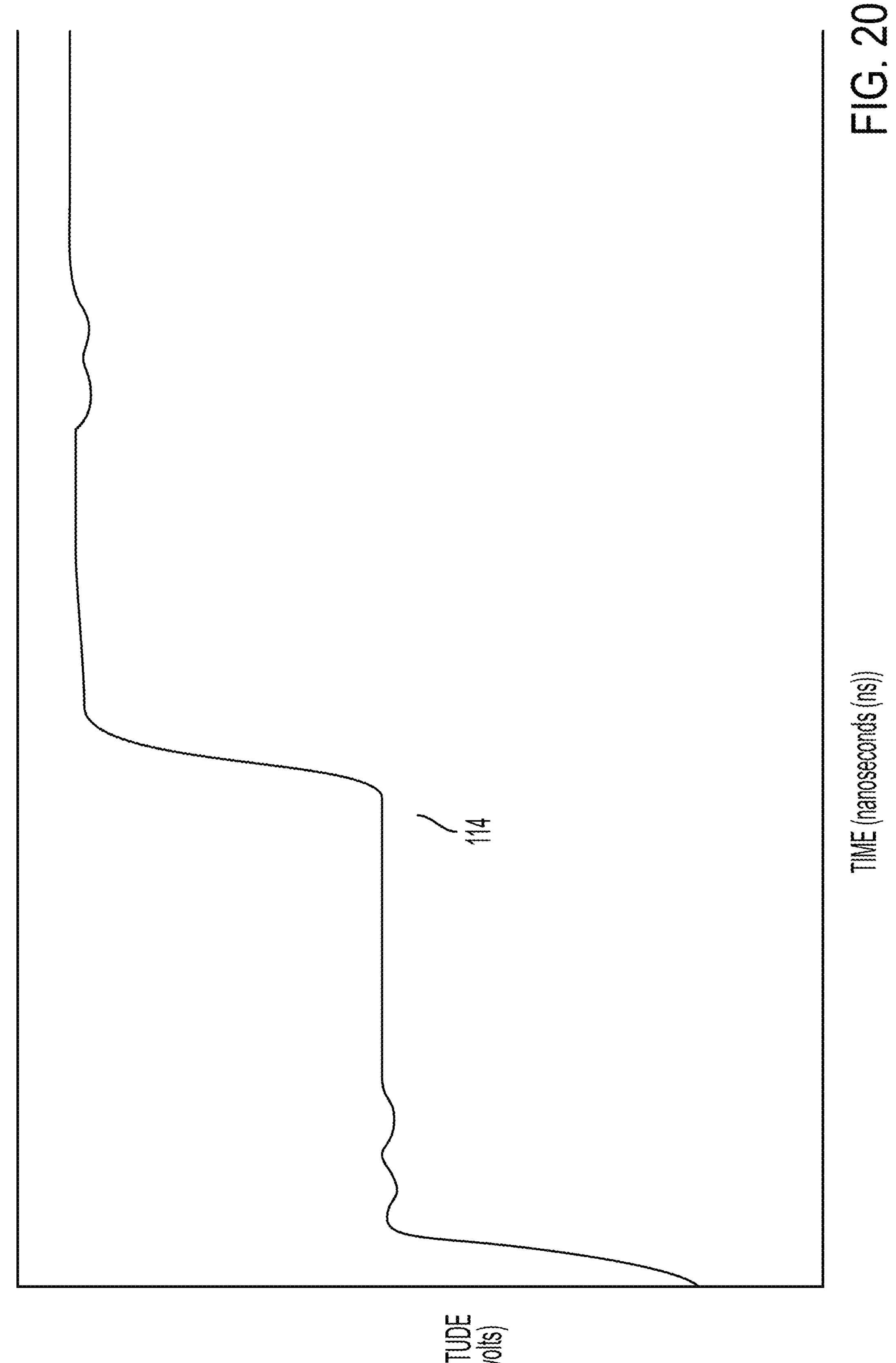
FIG. 20 is a graph showing an example reconstructed approximation of an incident edge of a waveform obtained using the example process of FIG. 19.

In this example, the data collected by operations **112*b*1 to 112*b*7 from the incident and reflected waveforms is retrieved from memory, such as a random access memory (RAM), and processed to construct (112*c*) an approximation of the incident waveform. For example, FPGA 74*a* or one or more processing devices elsewhere on test instrument or test system may process the data to construct the approximation the approximation of the incident waveform. In an example, a two-by-two array is created using the combined data from the time and voltage sweeps. The array is used to recreate an approximation of the incident waveform. To illustrate the technique, a table may be exported into Microsoft® Excel® with the vertical axis incrementing the threshold by 0.5 mV and the horizontal axis incrementing time by 1/16 ns. For each cell, if the measured voltage was greater than the threshold, a "1" is printed, otherwise a null is printed. An example 114 of a reconstruction the incident waveform created using this technique is shown in FIG. 20. Note that Microsoft® Excel® may not be used during automated testing to produce reconstructed waveforms such as that shown in FIG. 20**.

Process 112 analyzes the constructed approximation (FIG. 20) of the waveform to identify (**112*d*) one or more attributes of transmission line 60*a* such as, but not limited to, a change in impedance in the transmission, one or more impedances on the transmission line, an electrical length of the transmission line, and where on the transmission line one, more, or all of these are located. Since each instance of pin electronics 76*a* associated with a transmission line may be used in performing the processing of operations 112*b*1 to 112*b*7 in parallel, attributes of multiple transmission lines may be determined at the same time or at about the same time—for example, concurrently, simultaneously, or contemporaneously. In some implementations, the transmission lines may be tested consecutively, one after the other, rather than in parallel. Ranges of values and tolerances therefor may be set to identify (112*d*) the one or more attributes of transmission line 60*a***. These ranges and tolerances therefor may be programmed by a user into the test system, e.g., into a test program run on the test system.

The length of time used for capture may be proportional to the maximum transmission line propagation delay supported. The time is a suggested starting point to support reasonable length transmission lines. In an example, the minimum pulse width—for example, waveform output onto the transmission line—may be at least 200 ns for a period of 400 ns to allow for multiple reflections to settle before driving low for a next sample. In an example, for TDR mode, the driver edge is a 1V swing from 0V to 1V. In this example, the detector threshold is initially set to −0.5V. In this example, for every instance of t, the state of the detector is stored where a 0x1 indicates the observed level is greater than the detect threshold, and a 0x0 indicates that the observed level is less than the detect threshold. In this example, once this is done for all instances of t from t=0 to t=50 ns, the detector threshold may be incremented by 10 mV. In this example, the time sweep is then performed for this new threshold and the detector states are captured by the FPGA as described. In this example, the process continues increasing the detector 10 mV until the detector threshold is 2.05V. This voltage sweep provides 2114 steps or 8 bits of vertical data. A two by two array is created using the combined data from the time and voltage sweeps. In this example, the array is used to construct (**112*c***) an approximation of the waveform using the data for the waveform.

Process 112 may generate (**112*e*) a report containing the attributes. The report may be textual and/or graphical and may include an analysis of each transmission line that was tested and/or each segment of the transmission line that was tested. For example, the report may identify connectors in the transmission lines, where those connectors are located, changes in impedance in the transmission line, where those changes are located, one or more impedances on the transmission line, where those impedances are located, an electrical length of the transmission line, whether there are intermittent faults in the transmission line, where those intermittent faults are located, lengths of the transmission line or segments thereof, or any other information that can be identified or determined using the data captured by process 112**.

An implementation of process 112 is described in U.S. patent application Ser. No. 18/525,269 titled "Analyzing Transmission Lines". That implementation may be used in in conjunction with the processes described herein. The content of U.S. patent application Ser. No. 18/525,269 is incorporated herein by reference.

Figure 21:
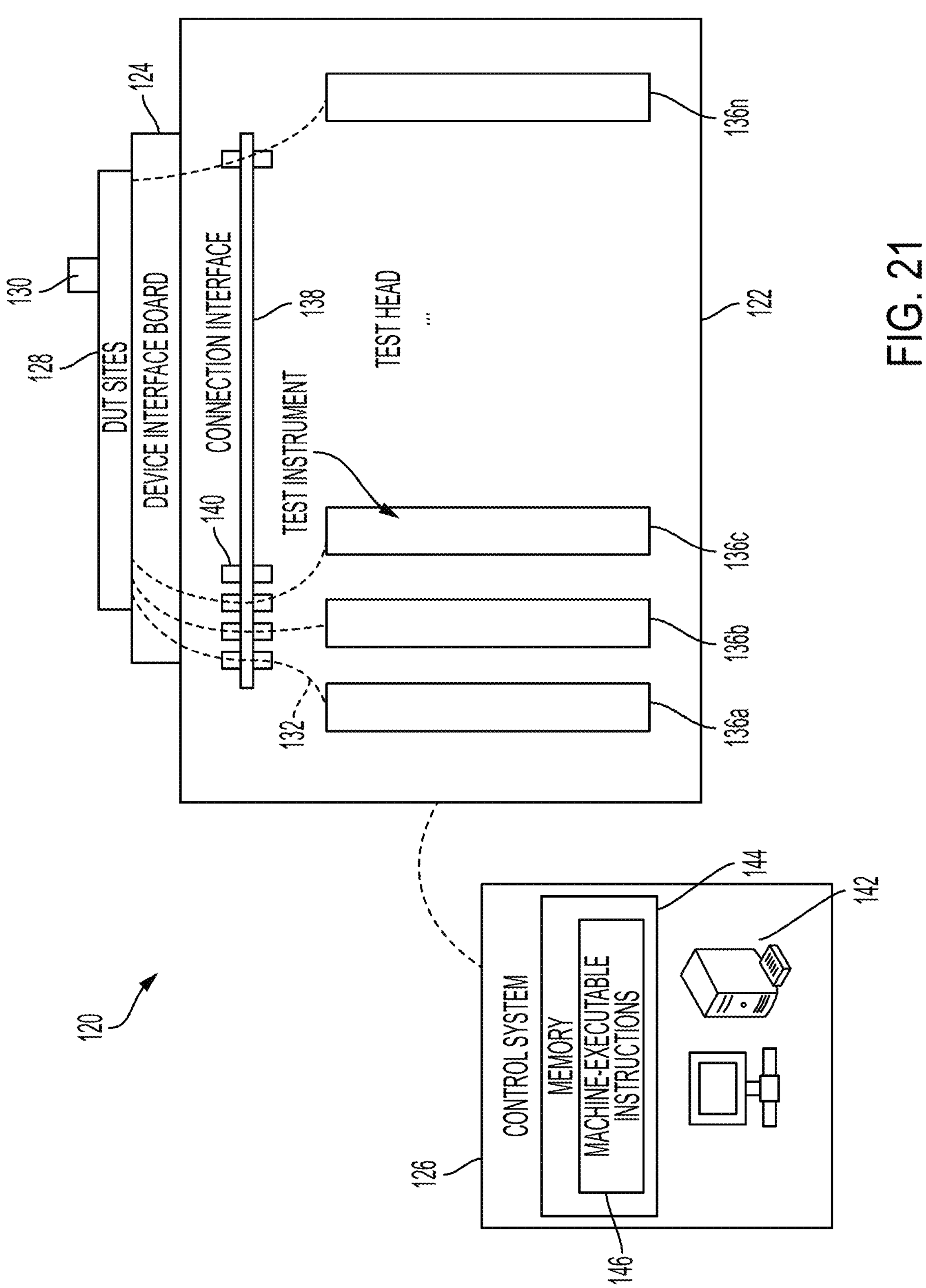
FIG. 21 is a block diagram of example components of an example test system on which all or part of the example processes described herein may be implemented.

FIG. 21 shows components of example automatic test equipment (ATE) 120 that may be an example implementation of, or include components of, test system 52 of FIG. 8 or test system 70 of FIG. 9. ATE 120 includes a test head 122, a device interface board (DIB) 124 and a control system 126.

DIB 124 is connected to test head 122 and includes mechanical and electrical interfaces at sites 128 to one or more DUTs, such as DUT 130, that are being tested or are to be tested by the ATE. Power, including voltage, may be run via one or more layers in the DIB to DUTs connected to the DIB. DIB 124 also may include one or more ground layers and one or signal layers with connected vias for transmitting signals to the DUTs.

Test signals and response signals, such as RF signals, and other types of signals pass via test channels 132 to the sites between the DUTs and various test instruments over DIB 124. Examples of test channels 132 may include bundles of wires and circuitry for routing signals between the test instruments, DUTs connected to sites 128, and other circuitry. Test channels 132 include wires that may be subjected to testing and identification described in processes 80, 110, and 112.

Control system 126 communicates with components included in the test head to control testing. For example, control system 126 may download test program sets to test instruments 136*a*, 136*b*, 136*c*, and 136*n* in the test head. Test instruments 136*a*, 136*b*, 136*c*, and/or 136*n* may implement test instrument 78. In an example, a test program generates a test pattern (or flow) to provide to the DUT. The test pattern is written to output test signals to elicit a response from the DUT, for example. As noted, the test signals and the response from the DUT may include digital signals.

As indicated above, the test instruments include hardware devices that may include one or more processing devices, pin electronics, programmable logic such as an FPGA, and memory. Test instruments 136*a* to 136*n* may run the test program sets to test DUTs held on the DIB, which testing includes, but is not limited to, the TDR and crosstalk testing of processes 80, 110, and 112. Control system 126 may also send, to test instruments in the test head, instructions, test data, and/or other information that is usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

Test instruments 136*a* to 136*n* may each include tens, hundreds, or thousands of instances of pin electronics such as pin electronics 76*a*, 76*b*, and be connected to respective test channels to a DUT, to perform one or more of testing and/or other functions described herein. Although only four test instruments are depicted, the system may include any appropriate number of test instruments, including those residing outside of test head 122. Signals, including RF, AC, and DC signals, may be sent to, and received from, the DUT over multiple test channels or other electrically conductive media.

In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

In some examples, test system 120 includes a connection interface 138 that connects test instrument test channels 132 to DIB 124. Connection interface 138 may include connectors 140 for routing signals between the test instruments and DIB 124. The connection interface may include one or more circuit boards or other substrates on which such connectors are mounted. Conductors that are included in the test channels may be routed through the connection interface and the DIB. The connection interface may, or may not, be considered part of each test channel in some implementations. An example component of connection interface 140 is connector 65 of FIG. 9.

Control system 126 may include one or more processing devices 142 and memory 144 storing instructions that are executable. The one or more processing devices 142 may execute instructions 146 to control, or to implement at least part of, processes 80, 110, and/or 112 alone or in conjunction with a test instrument or a component of the test instrument such as the FPGA and/or pin electronics.

In some implementations, the control functionality of the control system is centralized in processing device(s) 142. In some implementations, all or part of the control functionality attributed to control system 126 may also or instead be implemented on a test instrument and/or all or part of the testing functionality attributed to one or more test instruments may also or instead be implemented on control system 126. For example, the control system may be distributed across processing device(s) 142 and one or more of test instruments 136*a* to 136*n*.

All or part of the systems and processes described herein including but not limited to processes 80, 110, and 112, and their modifications may be configured, controlled, and/or implemented at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment.

A computer program can be deployed to be executed on one computer or on multiple computers at one site or distributed across multiple sites and interconnected by a system 100.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks.

Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

As used herein, the terms "comprises," "comprising," "includes," "including," "has," "having," "contains," "containing," and any variations thereof, are intended to cover a non-exclusive inclusion, such that systems, techniques, apparatus, structures, processes, or other subject matter described or claimed herein that includes, has, or contains an element or list of elements does not include only those elements but can include other elements not expressly listed or inherent to such systems, techniques, apparatus, structures, processes or other subject matter described or claimed herein.

All examples described herein are non-limiting.

In the description and claims provided herein, the adjectives "first", "second", "third", and the like do not designate priority or order unless context suggests otherwise. Instead, these adjectives may be used solely to differentiate the nouns that they modify.

Any mechanical or electrical connection herein may include a direct physical connection or an indirect physical connection that includes one or more intervening devices unless context suggests otherwise. A connection between two electrically conductive devices includes an electrical connection unless context suggests otherwise. The signals described herein are electrical signals unless context suggests otherwise.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system for detecting a fault in a bundle of wires, the bundle of wires comprising a first wire and a second wire, the system comprising:

a first driver that is electrically connectable to, and electrically disconnectable from, the first wire;

a second driver that is electrically connectable to, and electrically disconnectable from, the second wire; and control system to control the first driver to electrically connect to the first wire and to output a signal to the first wire, to control the second driver to electrically connect to the second wire and to drive a static voltage to the second wire to enable the second wire to act as a signal return for the first wire, and to detect a fault in the first wire based on a reflection of the signal on the first wire.

2. The system of claim 1, wherein the bundle of wires comprises a third wire and a fourth wire;

wherein the system comprises:

a third driver that is electrically connectable to, and electrically disconnectable from, the third wire; and a fourth driver that is electrically connectable, and electrically disconnectable from, the fourth wire; and wherein the control system is configured to control the third driver to electrically connect to the third wire and to output a signal to the third wire, to control the fourth driver to electrically connect to the fourth wire and to drive a static voltage to the fourth wire to enable the fourth wire to act as a signal return for the third wire, and to detect a fault in the third wire based on a reflection of the signal on the third wire.

3. The system of claim 1, wherein the static voltage is ground voltage.

4. The system of claim 1, wherein the static voltage is a direct current (DC) voltage.

5. The system of claim 1, wherein the control system is configured to identify the second wire based on an amount of crosstalk between the first wire and the second wire.

6. The system of claim 5, wherein identifying the second wire based on the amount of crosstalk comprises:

determining that an amount of crosstalk from the first wire on the second wire is greater than amounts of crosstalk on the second wire from one or more other wires.

7. The system of claim 5, wherein identifying the second wire based on the amount of crosstalk comprises:

comparing an amount of crosstalk from the first wire on the second wire to a predefined threshold; and identifying the second wire when the amount of crosstalk is greater than the predefined threshold.

8. The system of claim 7, wherein the predefined threshold is based on an attribute of the signal on the first wire.

9. The system of claim 8, wherein the predefined threshold is 5% or more of the attribute of the signal on the first wire.

10. The system of claim 7, wherein the predefined threshold is 3% or more of the attribute of the signal on the first wire.

11. The system of claim 1, wherein the first wire and the second wire are in physical proximity to each other such that a characteristic impedance of the first wire relative to the second wire is 150Ω or less.

12. The system of claim 1, wherein the first wire and the second wire are in physical proximity to each other such that a characteristic impedance of the first wire relative to the second wire is 100Ω or less.

13. The system of claim 1, wherein the first wire and the second wire are in physical proximity to each other such that a characteristic impedance of the first wire relative to the second wire is between 40Ω and 150Ω inclusive.

14. The system of claim 1, wherein the bundle of wires comprises multiple wires including the second wire;

wherein the system comprises multiple drivers that are electrically connectable to, and electrically disconnectable from, respective ones of the multiple wires; and wherein the control system is configured to control the multiple drivers to electrically connect to respective one of the multiple wires to each drive a static voltage to a respective one of multiple wires to enable each of the multiple wires to act as a signal return for the first wire.

15. The system of claim 14, wherein the first wire is bordered, at least in part, by two or more of the multiple wires.

16. The system of claim 14, wherein the first wire is surrounded by three or more of the multiple wires.

17. The system of claim 1, further comprising:

circuitry to detect data following output of the signal to the first wire, the data being based on a reflection of the signal on the first wire.

18. The system of claim 17, wherein the control system is configured to detect at least one of the fault, a short circuit, or an open circuit on the first wire based on the data.

19. The system of claim 17, wherein the control system is configured to use at least one of time domain reflectometry (TDR) testing, spread spectrum TDR (SSTDR) testing, or sequence TDR (STDR) testing to detect the fault, the short circuit, or the open circuit.

20. A method of testing a first wire, comprising:

controlling a first driver to output a signal on the first wire;

controlling a second driver to drive a static voltage to the second wire to cause the second wire to act as a signal return for the first wire;

obtaining data based on a reflection of the signal on the first wire; and testing the first wire based on the data.

21. The method of claim 20, further comprising:

identifying the second wire based on an amount of crosstalk between the first wire and the second wire.

22. The method of claim 21, wherein identifying the second wire based on the amount of crosstalk comprises:

determining that an amount of crosstalk from the first wire on the second wire is greater than amounts of crosstalk on the second wire from one or more other wires.

23. The method of claim 21, wherein identifying the second wire comprises:

comparing an amount of crosstalk from the first wire on the second wire to a predefined threshold; and identifying the second wire if the amount of crosstalk is greater than the predefined threshold.

24. The method of claim 23, wherein the predefined threshold is based on an attribute of a signal on the first wire.

25. The method of claim 24, wherein the predefined threshold is 5% or more of the attribute of the signal on the first wire.

26. The method of claim 24, wherein the predefined threshold is 3% or more of the attribute of the signal on the first wire.

27. The method of claim 20, further comprising:

controlling multiple drivers to each drive a static voltage to a respective one of multiple wires to cause one or more of the multiple wires to act as a signal return for the first wire, the multiple drivers including the second driver and the multiple wires including the second wire.

* * * * *